(12) United States Patent
Adducci et al.

(10) Patent No.: US 7,667,135 B2
(45) Date of Patent: Feb. 23, 2010

(54) NETWORK CABINET

(75) Inventors: Samuel J Adducci, Palos Heights, IL (US); Michael J McGrath, New Lenox, IL (US); Richard C VanByssum, Oak Lawn, IL (US); Jonathan D Walker, Chicago, IL (US); Brendan F. Doorhy, Westmont, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 11/926,847

(22) Filed: Oct. 29, 2007

(65) Prior Publication Data
US 2008/0067903 A1    Mar. 20, 2008

Related U.S. Application Data

(62) Division of application No. 11/623,839, filed on Jan. 17, 2007, and a division of application No. 11/467,956, filed on Aug. 29, 2006.

(60) Provisional application No. 60/781,923, filed on Mar. 13, 2006.

(51) Int. Cl.
*H02G 3/08* (2006.01)

(52) U.S. Cl. .................. 174/50; 174/520; 361/600; 361/724; 312/223.1; 312/265.2

(58) Field of Classification Search ............ 174/50, 174/520, 17 R; 361/600, 601, 616, 641, 361/724, 730, 752, 796, 797; 211/26; 312/312.6, 312/223.1, 223.2, 351.1, 265.1, 265.2, 265.4, 312/227; 49/193; 16/230, 232; 439/535, 439/949
See application file for complete search history.

(56) References Cited

U.S. PATENT DOCUMENTS

| 1,673,450 | A | 6/1928 | Gilpin |
| 1,775,974 | A | 9/1930 | Solms, Jr. |
| 2,796,628 | A | 6/1957 | Van Meter |
| 2,938,247 | A | 5/1960 | Hagerty |
| 3,048,899 | A | 8/1962 | Vincent |
| 3,307,295 | A | 3/1967 | Rolin |
| 3,403,473 | A | 10/1968 | Navarro |
| 3,662,493 | A | 5/1972 | Foltz |
| 3,750,334 | A | 8/1973 | Slaybaugh |
| 4,555,744 | A | 11/1985 | Maroney et al. |

(Continued)

FOREIGN PATENT DOCUMENTS

| EP | 0844709 A2 | 5/1998 |
| FR | 2825406 A1 | 12/2002 |

*Primary Examiner*—Angel R Estrada
(74) *Attorney, Agent, or Firm*—Robert A. McCann; Christopher S. Clancy

(57) ABSTRACT

A network cabinet is provided comprising a support frame and a threshold associated with the support frame. A door comprising first and second lateral sides is mounted to the support frame through a hinge pin. The hinge pin is moveable between retracted and extended positions and is positioned closer to the first lateral side of the door than the second lateral side. A bearing surface is also associated with the support frame and is aligned with the hinge pin such that the door is elevated relative to the threshold with the hinge pin in the extended position and in contact with the bearing surface.

16 Claims, 40 Drawing Sheets

U.S. PATENT DOCUMENTS

| | | | |
|---|---|---|---|
| 4,610,489 A * | 9/1986 | Dibert et al. | 312/227 |
| 4,811,518 A | 3/1989 | Ladisa | |
| 4,849,793 A | 7/1989 | Someya | |
| 4,869,023 A | 9/1989 | Bakula et al. | |
| 5,148,629 A | 9/1992 | Minami | |
| 5,540,339 A | 7/1996 | Lerman | |
| 5,548,927 A | 8/1996 | Song | |
| 5,806,687 A | 9/1998 | Ballesteros et al. | |
| 5,829,197 A | 11/1998 | Oh | |
| 5,926,916 A | 7/1999 | Lee et al. | |
| 5,983,453 A | 11/1999 | Miwa | |
| 6,000,771 A | 12/1999 | Wissinger et al. | |
| 6,065,612 A | 5/2000 | Rinderer | |
| 6,118,071 A | 9/2000 | Münch et al. | |
| 6,348,655 B1 * | 2/2002 | Wright | 174/50 |
| 6,467,640 B1 * | 10/2002 | Hung | 174/50 |
| 6,489,565 B1 | 12/2002 | Krietzman et al. | |
| 6,605,782 B1 | 8/2003 | Krietzman et al. | |
| 6,688,657 B2 | 2/2004 | Peacock et al. | |
| 6,712,434 B2 * | 3/2004 | Knab et al. | 312/265.4 |
| 6,766,093 B2 | 7/2004 | McGrath et al. | |
| 6,814,244 B1 | 11/2004 | Hathcock | |
| 6,884,942 B2 | 4/2005 | McGrath et al. | |
| 6,893,299 B2 | 5/2005 | Baker et al. | |
| 6,946,605 B2 | 9/2005 | Levesque et al. | |
| 2004/0173545 A1 | 9/2004 | Canty et al. | |
| 2004/0226900 A1 | 11/2004 | Canty et al. | |
| 2005/0186858 A1 | 8/2005 | Baker et al. | |
| 2005/0247650 A1 | 11/2005 | Vogel et al. | |

\* cited by examiner

NETWORK CABINET

CROSS-REFERENCE TO RELATED APPLICATIONS

This application is a divisional of patent application Ser. No. 11/623,839, filed Jan. 17, 2007, which is a divisional of patent application Ser. No. 11/467,956, filed Aug. 29, 2006, and claims the benefit of provisional patent application No. 60/781,923, filed Mar. 13, 2006.

FIELD OF THE INVENTION

This invention relates to network cabinets for cable connections and, more particularly, to grounded cabinets for switching and patching applications.

BACKGROUND

There is a need for cabinets that provide cabinet access to the internal portions of the cabinet to install or modify cable connections and to provide less obtrusive ways to ground the cabinet, as well as other features that provide efficiencies and conveniences.

SUMMARY OF THE INVENTION

The present invention relates generally to an improved network cabinet.

In one embodiment, a network cabinet is provided comprising a support frame and a threshold associated with the support frame. A door comprising first and second lateral sides is mounted to the support frame through a hinge pin. The hinge pill is moveable between retracted and extended positions and is positioned closer to the first lateral side of the door than the second lateral side. A bearing surface is also associated with the support frame and is aligned with the hinge pill such that the door is elevated relative to the threshold with the hinge pin in the extended position and in contact with the bearing surface.

In another embodiment, a network cabinet is provided comprising a support frame and a door electrically connected 10 the support frame through a hinge assembly.

In another embodiment, a network cabinet is provided comprising a handle and a cam plate connected to the handle, such that the handle and the cam plate rotate about an axis of rotation. A first rod is rotatably connected to the cam plate and rotates about a first axis of rotation. A second rod is also rotatably connected to the cam plate and rotates about a second axis of rotation. A first plane defined by the axis of rotation and the first axis of rotation is generally perpendicular to a second plane defined by the axis of rotation and the second axis of rotation.

BRIEF DESCRIPTION OF THE DRAWINGS

Certain embodiments of the present invention are illustrated by the accompanying figures. It should be understood that the figures are not necessarily to scale and that details that are not necessary for an understanding of the invention or that render other details difficult to perceive may be omitted. It should be understood of course, that the invention is not necessarily limited to the particular embodiments illustrated herein.

DETAILED DESCRIPTION

Figure 1:
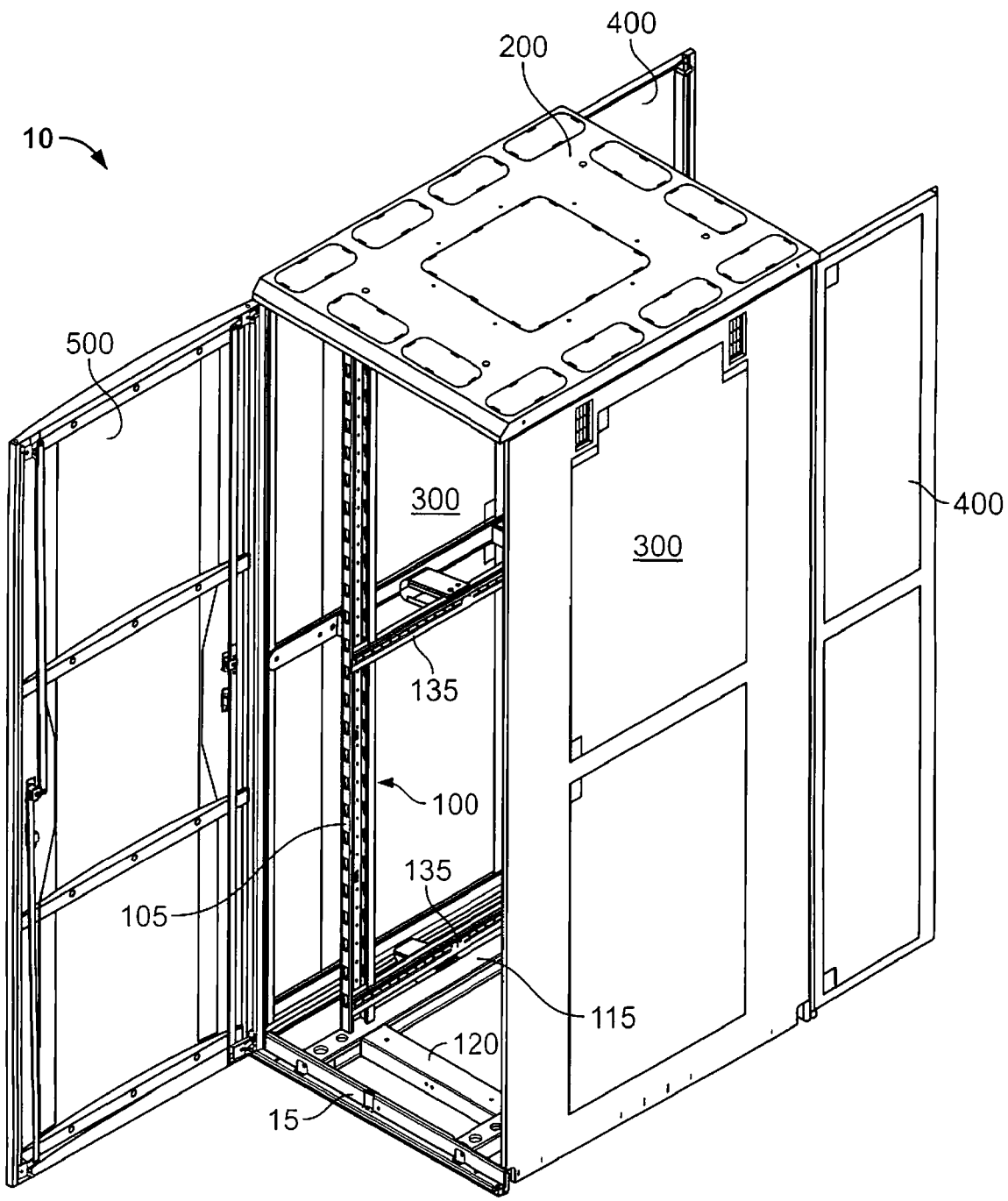
FIG. 1 is a front perspective view of the network cabinet of the present invention.

Referring to FIG. 1 one embodiment of a network cabinet 10 according to the present invention is shown. In the embodiment shown, the network cabinet generally includes a base frame 100, top cover 200, side panels 300, back doors 400, and front door 500. When fully assembled, the exemplary network cabinet is approximately 32 inches wide, 40 inches deep, and 84 inches high and has 45 rack units with a 2,000 pound load rating.

Figure 2A:
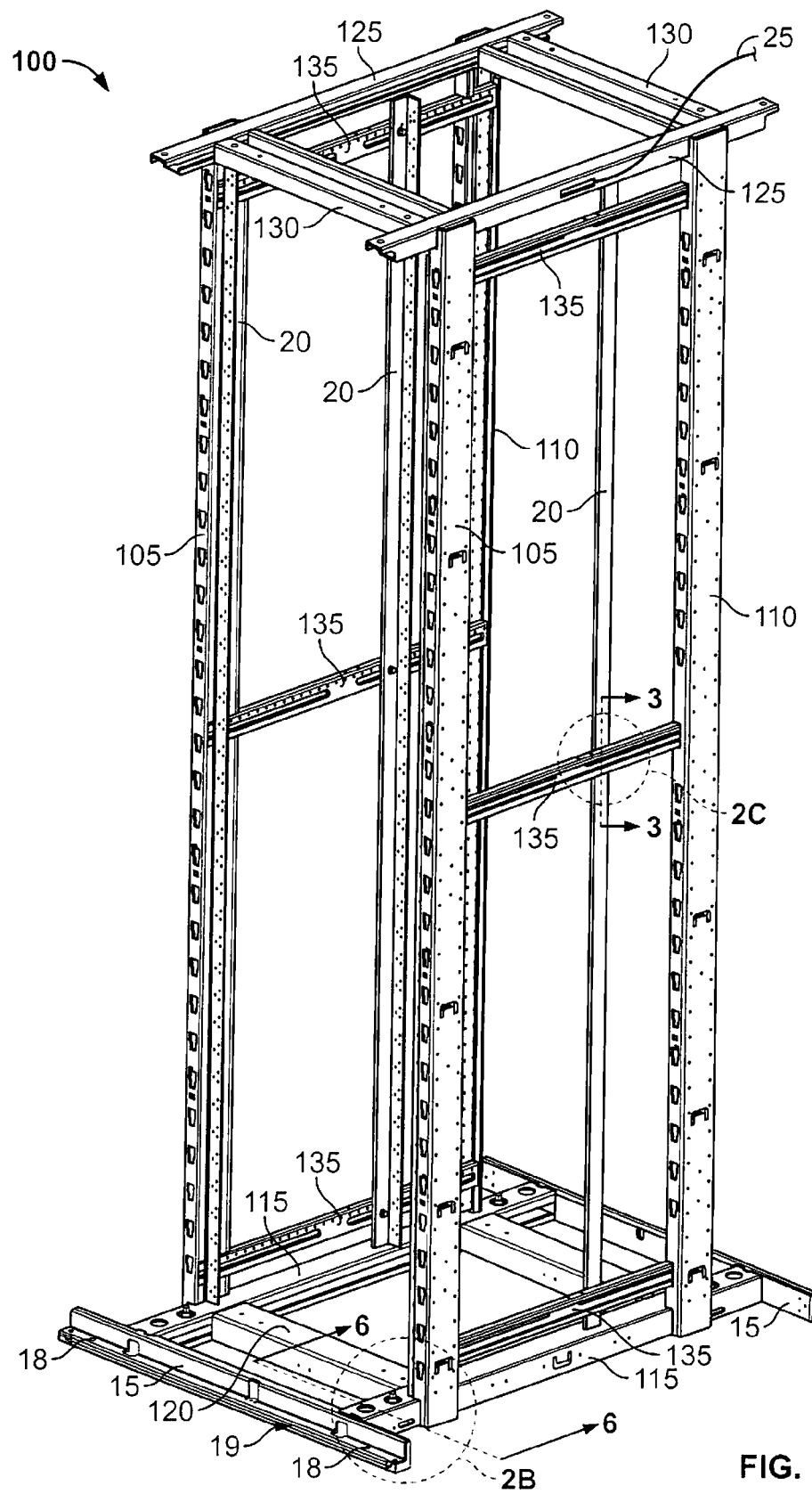
FIG. 2A is a front perspective view of the base frame of the network cabinet of the present invention.

Referring to FIG. 2A, an exemplary base frame 100 of the network cabinet 10 is shown. In this embodiment, the base frame 100 is conductive and generally includes a pair of front vertical frame rails 105, a pair of back vertical frame rails 10, a pair of front to back base beams 115, a pair of side to side base beams 120, a pair of front to back top beams 125, a pair of side to side top beams 130, and front to back support beams 135, all of which are typically steel but can be made of any suitable conductive or non-conductive material. As can be seen in FIGS. 1 and 2A and as described in more detail below, the front and back vertical frame rails 105, 110 are inset from side panels 300, back doors 400, front door 500, and the corners of the network cabinet 10 that are formed by side panels 300, back doors 400, and front door 500. This inset provides unobstructed space along all of the sides of the network cabinet 10 for cable management pathways.

In the embodiment shown, the side to side base beams 120 have a rectangular cross-section geometry and are positioned between and perpendicular to the front to back base beams 115, which also have a rectangular cross-section geometry. The side to side base beams 120 are welded to the front to back base beams 115 and, along with the door mounts 15, form a base member for the network cabinet and define openings 123, as seen in FIG. 2D as the cross-hatched areas. The front vertical frame rails 105 and back vertical frame rails 110 have a generally "C" shaped cross-section geometry and ale positioned vertically on the front to back base beams 115 and welded to the front to back base beams 115. The space created by setting frame rails 105, 110 back from the side panels 300 provides cable management pathway between the frame rails 105, 110 and the side panels 300 when the network cabinet is fully assembled. The side to side top beams 130 have a generally "U" shaped cross-section geometry and are positioned between and perpendicular to the front to back top beams 125, which have a generally "C" shaped cross-section geometry. The side to side top beams 130 are welded to the front to back top beams 125 to form a support for the top cover and are supported by vertical frame rails 105, 110. The front to back top beams 125 are positioned at the top end of the front and back vertical frame rails 105, 110 and welded to the front and back vertical frame rails 105, 110. The front and back vertical frame rails 105, 110 are positioned so that they are set back from the corresponding ends of the front to back base beams 115. The space created by setting the frame rails 105, 110 back from the ends of the front to back base beams 115 provides a cable management pathway between the frame rails 105, 110 and the front and back doors 500, 400 when the network cabinet is fully assembled.

In the embodiment shown, the front to back support beams 135 have a generally "C" shaped cross-section geometry, are positioned between and perpendicular to corresponding front and back vertical frame rails 105, 110, and are welded to the front and back vertical frame rails 105, 110. By welding together all of the steel components of the base frame 100, the base frame 100 is a single conductive, bonded unit. In addition, in this example, a ground whip 25 is bonded to front to back top beam 125 and is, in turn, connected at its opposing end to a main building ground. Ground whip 25 can also be attached to any other base frame 100 structural member to provide a single ground point for the base frame 100.

Figure 2B:
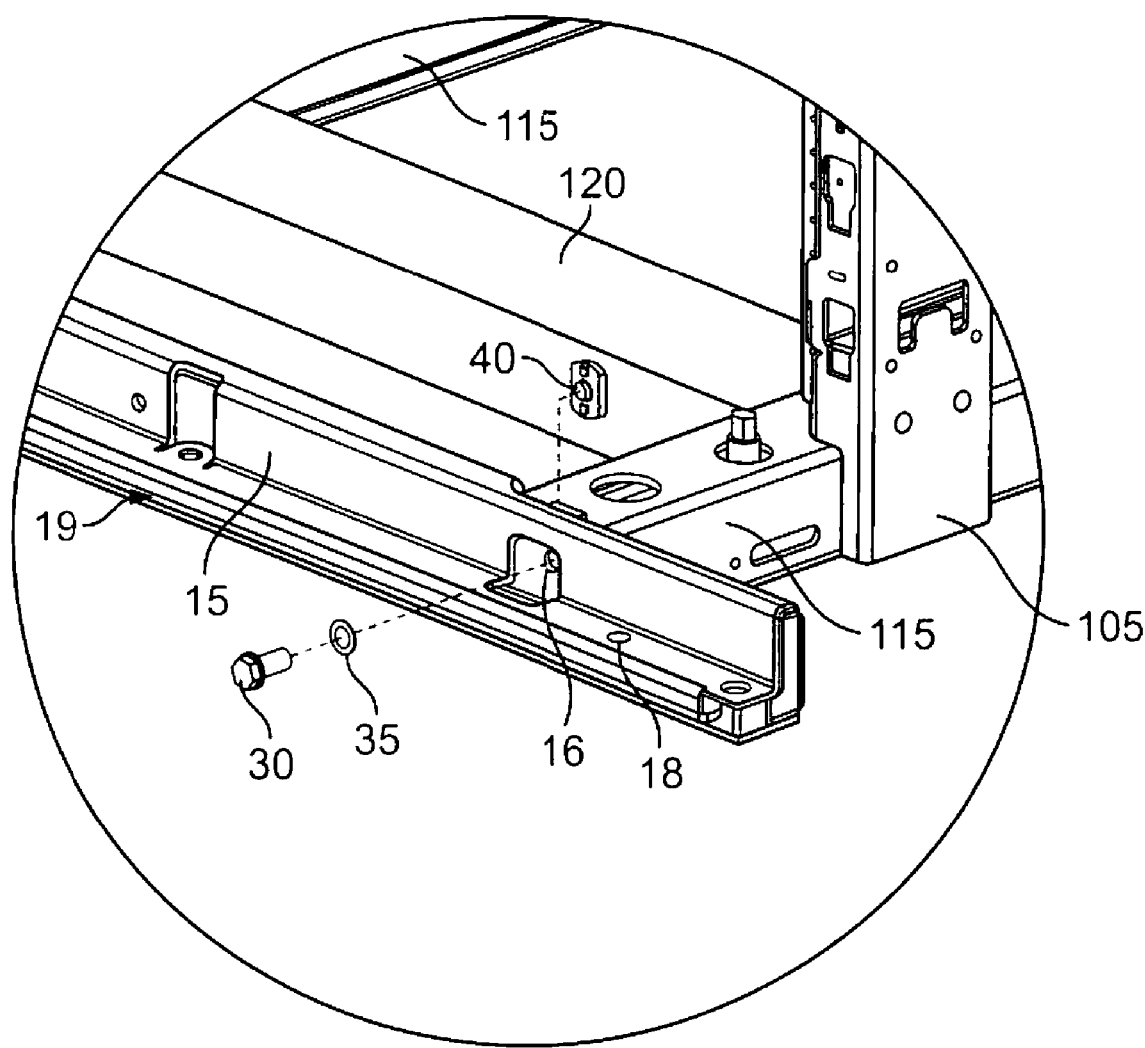
FIG. 2B is an enlarged partial exploded view of the front door mount and base frame shown in FIG. 2A.

Referring to FIGS. 2A and 2B, a pair of steel door mounts 15 are shown that have a generally "L" shaped cross-section geometry. Door mounts 15 are used to support the back and front doors 400, 500, and in the example shown the generally horizontal portion of the "L" shaped door mounts 15 create a threshold 19 that back and front doors 400, 500 ride over. Door mounts 15 and base frame 100 together form a support frame for network cabinet 10. Each door mount 15 is attached to an end of each front to back base beam 115 by bolts 30 that extend through holes 16 in the door mounts 15 and thread into nuts 40 that are welded to end caps (not shown), which are attached and bonded to the ends of the front to back base beams 115, such as by welding. In addition, as shown in FIG. 2B, at one of the two attachment points the door mount 15 is also bonded to the front to back base beam 115 by placing an internal tooth lock washer 35 between the bolt 30 and the door mount 15. The bolt 30 is inserted through the internal tooth lock washer 35 and through a hole 16 in the door mount 15 and is threaded into nut 40. The internal tooth lock washer 35 has teeth that pierce the paint or coating on the door mount 15 and bite into the metal of the door mount 15 to provide a ground path between the door mount 15 and the front to back base beam 115 through washer 35, bolt 30, and nut 40. An anti-oxidant paste could also be placed on the door mount 15, between the door mount 15 and lock washer 35, to prevent possible corrosion where the teeth of the lock washer 35 bite into the metal of the door mount 15. Alternatively, a regular washer could be used and the area around the hole 16 could be masked off or a serrated head bolt could be used in place of the bolt 30 and internal tooth lock washer 35 to similarly provide a bond between door mount 15 and front to back base beam 115 if bonding is desired.

Although the various elements of base frame 100 and door mounts 15 have been described above as having a particular geometry, being made of a particular material, and having particular connections, it will be understood that each of these elements could be made of varying geometries, varying materials, and connected by any suitable means as a particular application requires. For example, rather than using door mounts 15 that are bolted to the base member, door mounts 15 could be welded to the base member or be formed as an integral part of the base member.

Figure 2C:
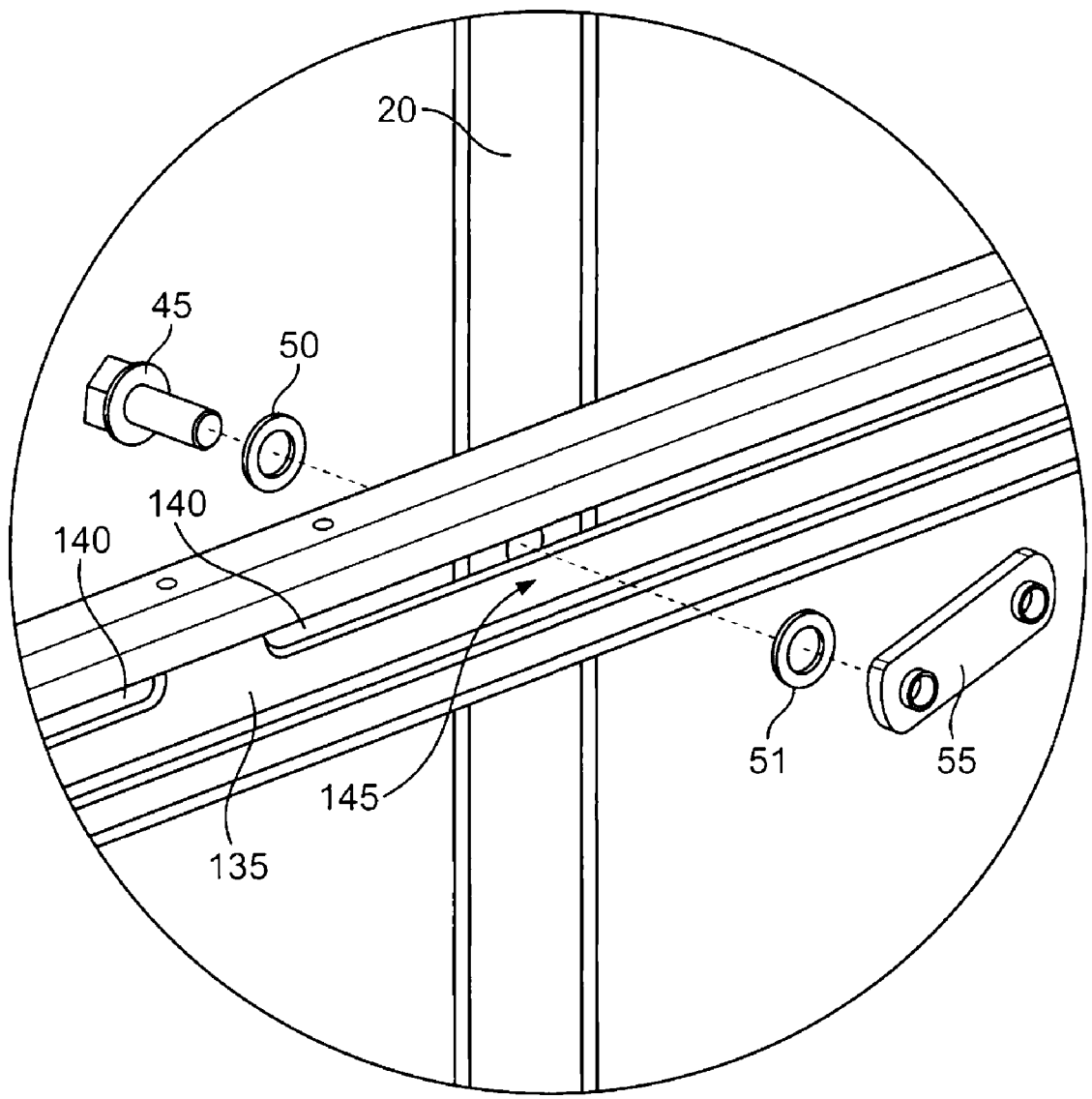
FIG. 2C is an enlarged partial exploded view of the adjustable equipment rail and base frame shown in FIG. 2A.
Figure 2D:
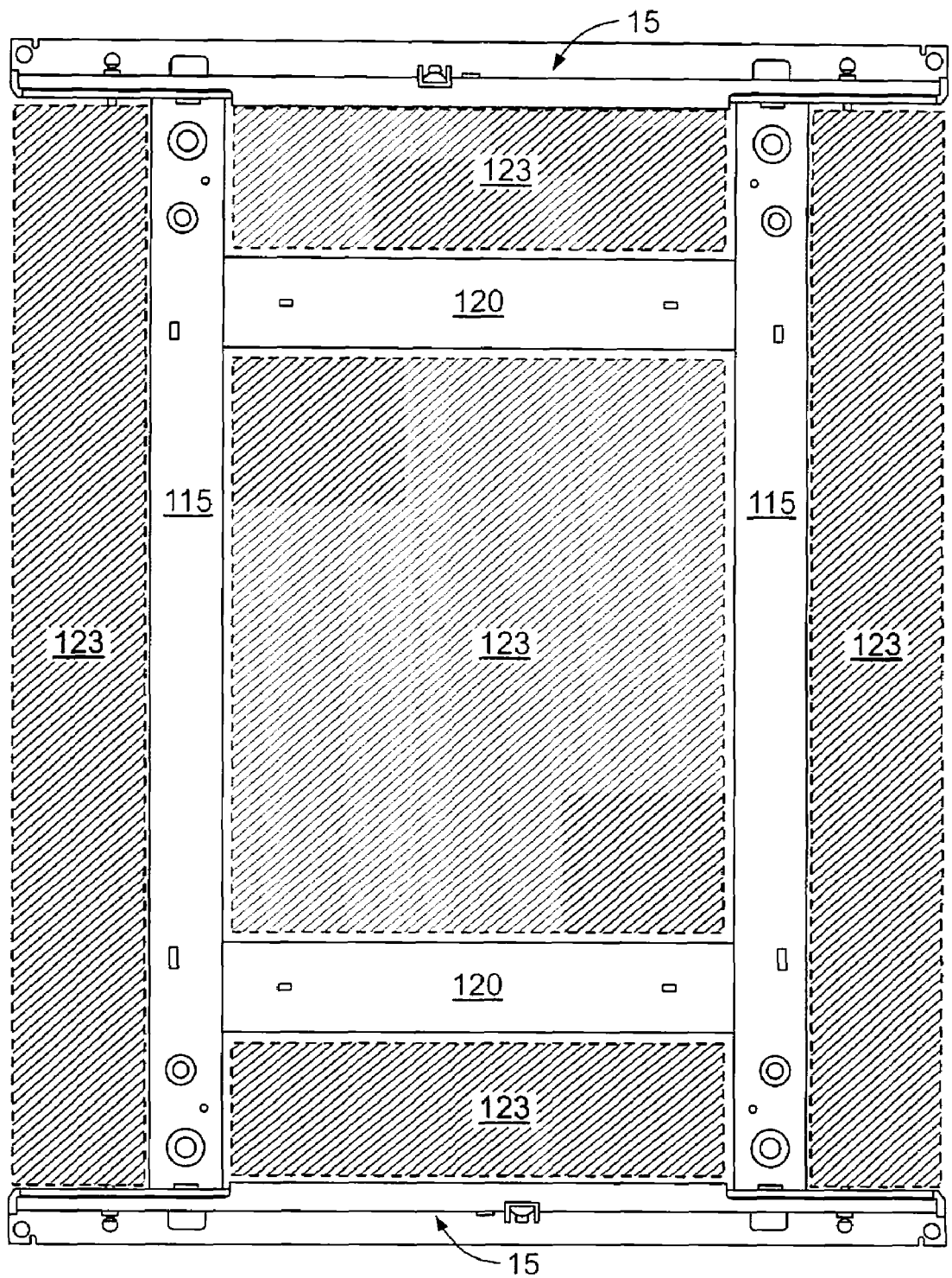
FIG. 2D is a top view of the base member of the network cabinet of the present invention.
Figure 3:
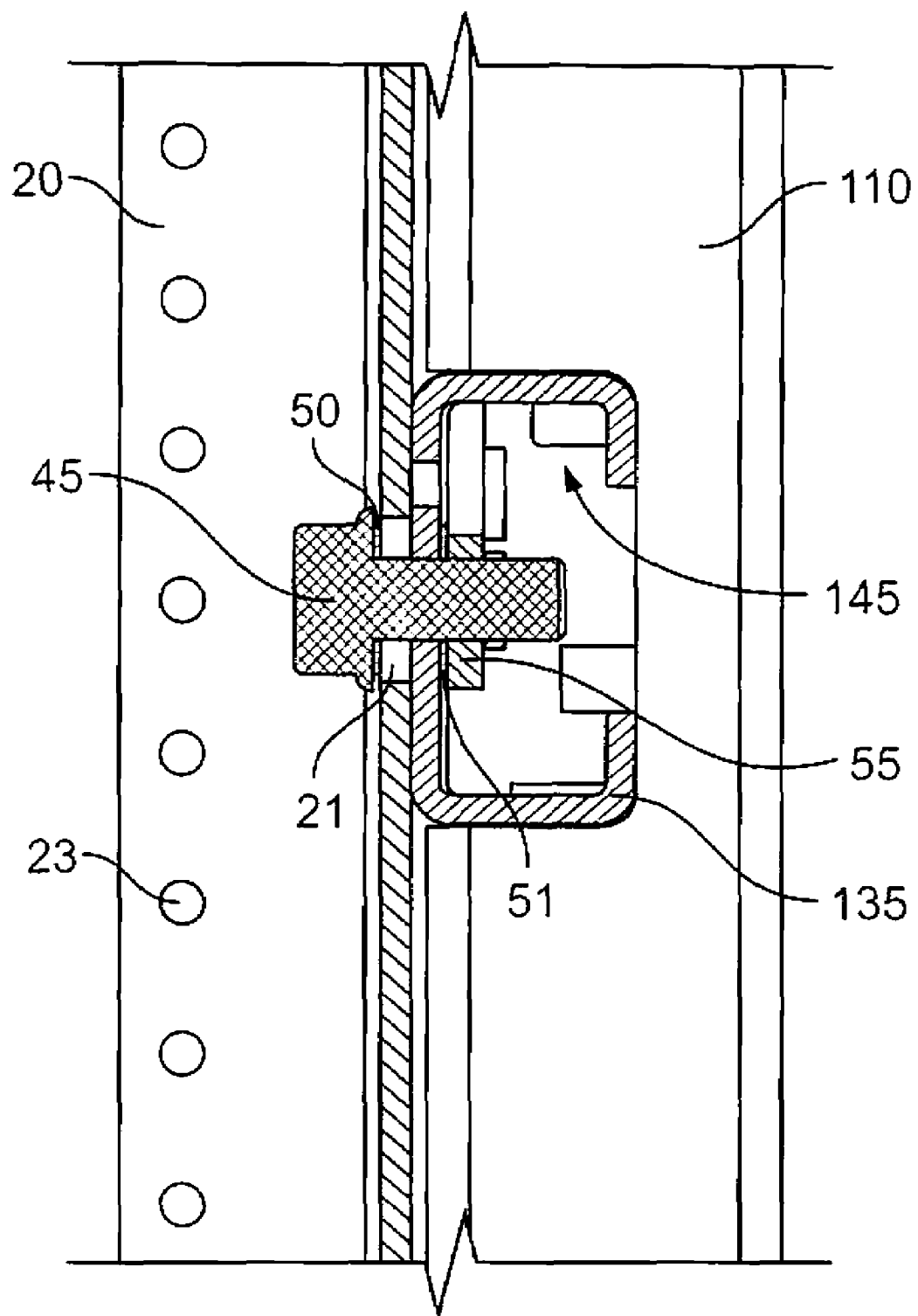
FIG. 3 is a cross-sectional view taken along line 3-3 in FIG. 2A.

Referring to FIGS. 2A, 2C, and 3, in this embodiment steel adjustable equipment rails 20 are shown that have a generally "L" shaped cross-section geometry and are used to mount equipment, such as patch panels, switches, or other network hardware equipment (not shown) in the network cabinet. Adjustable equipment rails 20 can also be made of other materials and have other geometries as required by a particular application. As can best be seen in FIG. 3, the equipment rails 20 each have a series of mounting holes 23 that are used to mount equipment to the equipment rails 20. In one example, the mounting holes 23 can be tapped holes that are threaded to accept a mounting bolt or screw (not shown) or in another example can be square holes that are adapted to accept a caged nut, which will then accept a mounting bolt or screw. In addition, as described in more detail below, the equipment rails 20 can be adjusted in relation to the frame rails 105, 110 by sliding them forward and backward along the front to back support beams 135. The equipment rails 20 enable equipment to be mounted at four points and in the exemplary network cabinet 10 can accommodate mounting depths of up to 25.9 inches.

Each equipment rail 20 can extend approximately from a front to back base beam 115 to the corresponding front to back top beam 125 and is connected to each of the three front to back support beams 135 which are each positioned at different elevations opposing sides of the base frame 100. In this embodiment, the equipment rails are connected to two of the front to back support beams 135 by inserting a bolt 45 through a hole 21 in one side of the equipment rail 20 and through a slot 140 (see FIG. 2C) in the front to back support beams 135 so that the threaded end of the bolt 45 extends into a channel 145 formed by the front to back support beam 135. A jam-nut 55 is positioned within the channel 145 and the bolt is threaded into the jam-nut 55. The jam-nut 55 here has an oblong configuration in which the length of the jam-nut 55 is greater than the width of the channel 145, thereby preventing rotation of the jam-nut 55 within the channel 145. The use of the jam-nut 55 allows the bolt 45 to be tightened without the need for a wrench or other tool to hold the nut securely within the channel 145. In addition, the use of bolt 45 and jam-nut 55 allows easy loosening of the connection between the adjustable equipment rails 20 and the front to back support beams 135, allowing for easy adjustment of the equipment rails 20 along front to back support beam 135.

In addition, as shown in FIGS. 2C and 3, in this embodiment at the third connection of equipment rail 20 to a front to back support beam 135, the connection is bonded by placing an internal tooth lock washer 50 between the bolt 45 and the equipment rail 20 and a second internal tooth lock washer 51 between the jam-nut 55 and the front to back support beam 135. The internal tooth lock washers 50, 51 have teeth that pierce the paint or coating and bite into the metal of the equipment rail 20 and front to back support beams 135. An anti-oxidant paste could also be placed on the equipment rail 20 and front to back support beam 135, underneath the lock washers 50, 51, to prevent possible corrosion where the teeth of the lock washers 50, 51 bite into the metal of the equipment rail 20 and front to back support beam 135. This provides a ground path from the equipment rail 20 to the front to back support beams 135 through the bolt 45, washers 50, 51, and jam-nut 55. This bonding makes adjustment of the equipment rails 20 more convenient since there are no jumper wires to disconnect and reconnect when the equipment rails 20 are moved. Alternatively, regular washers could be used and the area around the hole in the adjustable equipment rail 20 and the slot 140 in the front to back support beam 135 could be masked off or a serrated head bolt could be used in place of the bolt 45 and lock washer 50 if bonding is desired.

Figure 4A:
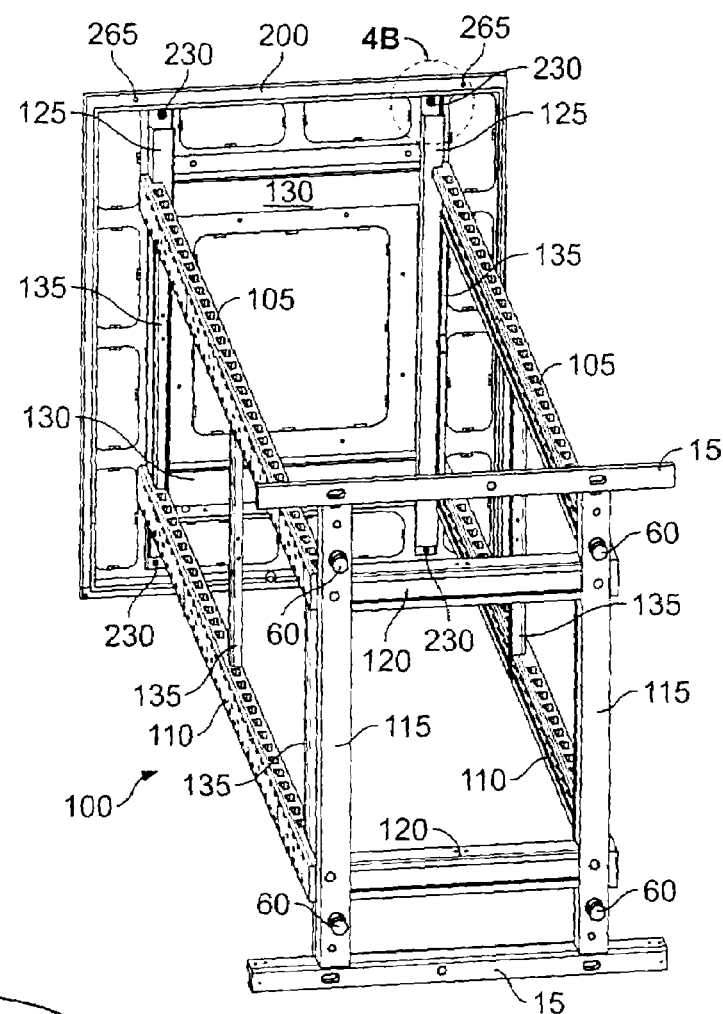
FIG. 4A is a bottom perspective view of the base frame of FIG. 2A and top cover of the network cabinet of the present invention.
Figure 4B:
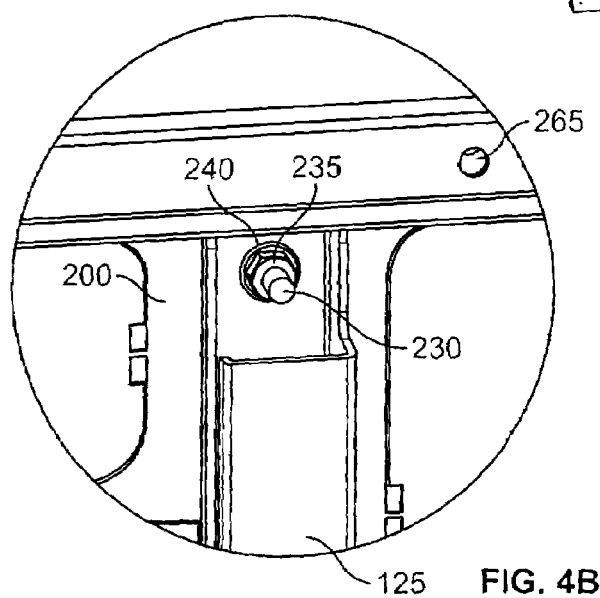
FIG. 4B is an enlarged partial view of the base frame and top cover shown in FIG. 4A.

Referring to FIGS. 4A and 4B, in this embodiment the top cover 200 is generally rectangular steel sheet having rolled over edges that is positioned on the front to back top beams 125 and side to side top beams 130 and secured to the front to back top beams 125. Four steel threaded members 230 are welded to the bottom side of the top cover 200 and extend from the bottom side of tile top cover 200 such that they align with holes or slots (not shown) in the top surfaces of the front to back top beams 125. The threaded members 230 are aligned with and inserted into the holes in the front to back top beams 125 such that they extend through the holes. On three of the threaded members 230, hex nuts 235 are threaded onto the threaded members 230 to secure the top cover 200. On the fourth threaded member 230, the top cover 200 is also bonded to the front to back top beam 125 by placing an internal tooth lock washer 240 between the hex nut 235 and the front to back top beam 125. An anti-oxidant paste could also be placed on the front to back top beam 125, underneath the lock washer 240, to prevent possible corrosion where the teeth of the lock washer 240 bites into the metal of the front to back top beam 125. This provides a ground path from the top cover 200 to the front to back top beam 125 through the threaded member 230, hex nut 235, and lock washer 240. Alternatively, a regular washer could be used and the area around the hole in the front to back top beam 125 could be masked off or an internal tooth hex nut could be used in place of hex nut 235 and lock washer 240 if bonding is desired. In addition, top cover 200 could be constructed of any geometry and material and be connected via any means appropriate for a given application.

Figure 5B:
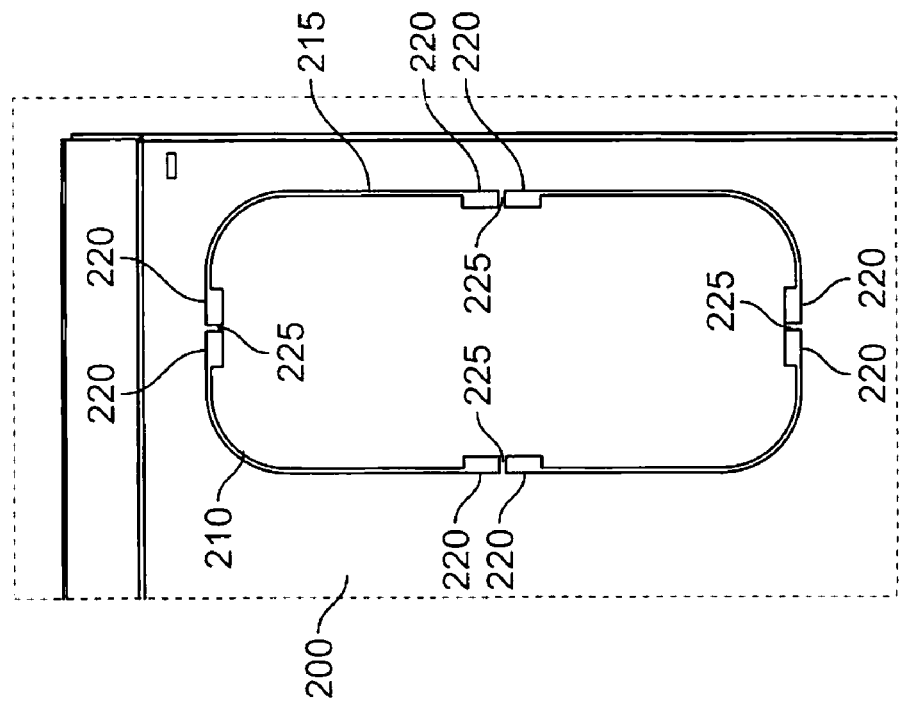
FIG. 5B is an enlarged partial view of a cable entry knockout shown in FIG. 5A.
Figure 5A:
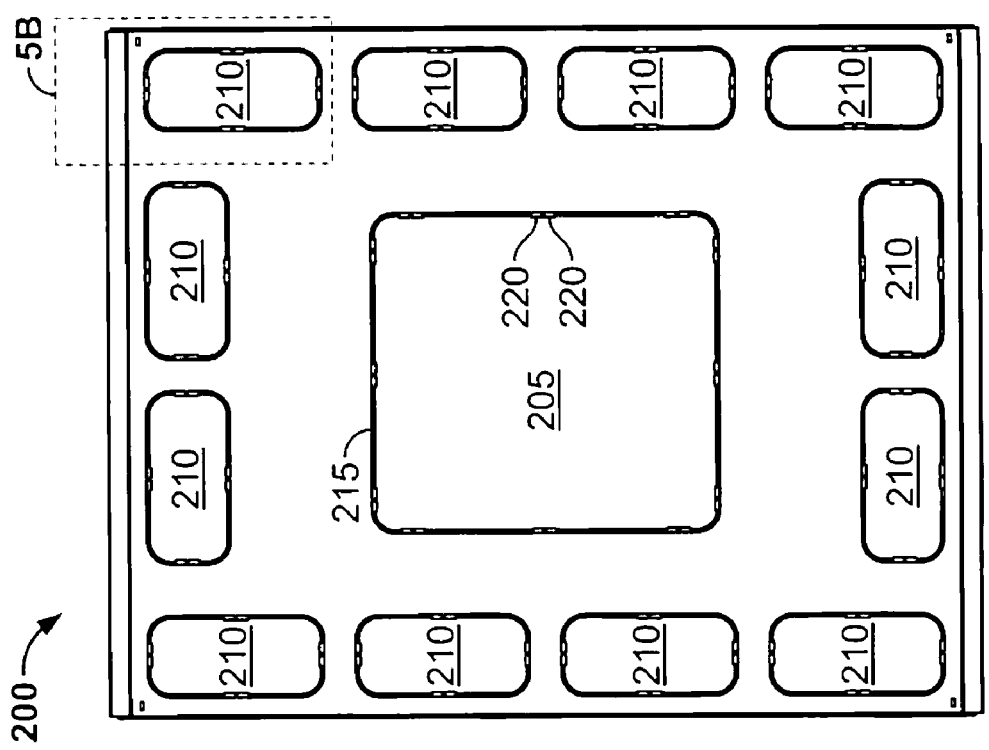
FIG. 5A is a top view of the top cover of the network cabinet of the present invention.

Referring to FIGS. 5A and 5B, the top cover 200 also has a center knockout 205 and multiple cable entry knockouts 210. The center knockout 205 can be removed to form an opening in top cover 200 to provide access to and ventilation for a fan mounted in the cabinet, for louvers, for cable entry, etc., and the cable entry knockouts 210 can be removed to form openings in top cover 200 to provide cable entry access in an over-head cable deployment application.

In this particular embodiment, each knockout 205, 210 is formed by cutting a slot 215 through the top cover 200 around the periphery of each knockout 205, 210. The slot 215 is cut almost completely around the periphery of each knockout 205, 210, except for the areas of the joining webs 225, which connect the main portion of the top cover 200 to the knockouts 205, 210 and hold the knockouts 205, 210 in place prior to removal. Each knockout 205, 210 has a minimum of four joining webs 225, as shown in FIG. 5B. The use of at least four joining webs 225 securely holds the knockouts 205, 210 in place in the installed position, whereas typical larger-size knockouts in sheet-metal components have been loosely held with only two joining webs and have been susceptible to inadvertent removal. In addition, at the end of each portion of the slot 215, there is an enlarged opening 220, which is sized to accept common hand tool cutters that can be used to cut the joining webs 225, which makes removal of the knockouts 205, 210 easier.

Figure 6:
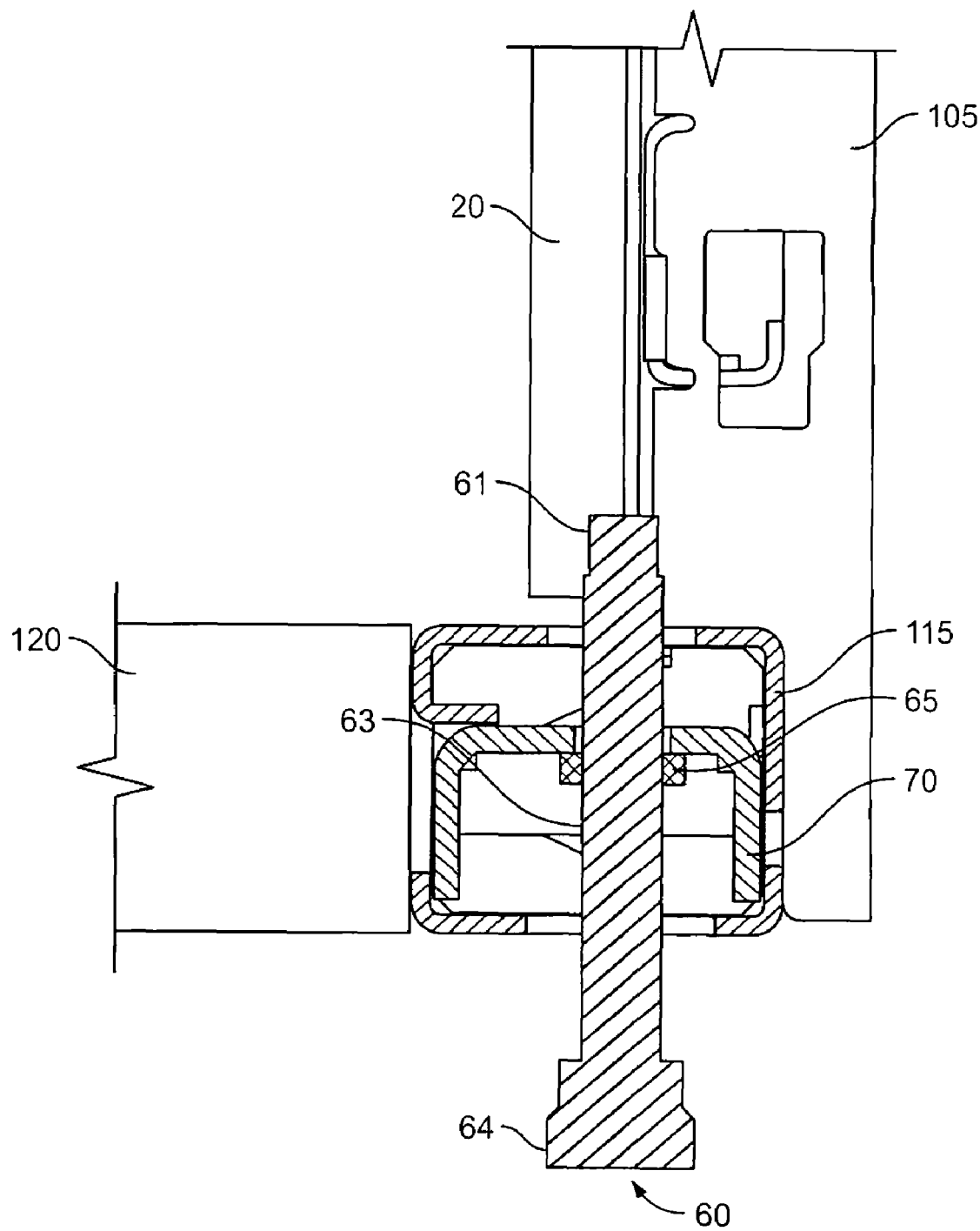
FIG. 6 is a cross-sectional view taken along line 6-6 in FIG. 2A.

Referring to FIGS. 4A and 6, our leveling legs 60 extend below the front to back base beams 115 to provide support and leveling capability for tile network cabinet. As can best be seen in FIG. 6, in this embodiment each leveling leg 60 has a top portion 61 that extends through the top surface of the front to back base beam 115 and is accessible above the front to back base beam 115. The top portion 61 has a hexagonal or other cross-section that can be used with a socket wrench or other similar tool to raise and lower the leveling legs 60, as described below. Alternatively, the top portion 61 could be slotted so that it can be used with a screwdriver or other similar tool to raise and lower the leveling legs 60. Each leveling leg 60 also has a threaded body portion 63. The threaded body portion 63 is threaded through a nut 65 that is welded to a leveling leg support 70, which is attached and bonded to the front to back base beam 115, such as by welding. This secures the leveling leg 60 to the front to back base beam 115 and allows adjustment of the leveling leg 60 as discussed below. The foot 64 of the leveling leg is positioned below the front to back base beam 115 and is the portion of the leveling leg 60 that rests on the ground or floor to provide support.

With this construction, to adjust the height or level the network cabinet, a socket wrench or other similar tool is placed on the top portion 61 and the leveling leg 60 is rotated. As the leveling leg 60 is rotated, the interaction of the threaded body portion 63 and the nut 65 will raise or lower the leveling leg 60 depending on the direction of rotation. In this fashion, adjustment of the height of the front to back base beam 115 off of the floor can be accomplished. Being able to access and rotate the leveling legs 60 from the top allows the leveling legs 60 to be easily adjusted without having to tip or move the network cabinet. It also assists with the installation/removal of optional casters, which is discussed in more detail below. Furthermore, when casters are not installed, the leveling legs 60 can be fully retracted into the front to back base beams 115 so that the front to back base beams 115 and side to side base beams 120 will sit on the ground and the cabinet load will be distributed.

Referring to FIGS. 7A, 7B, 8A, and 9, the side panels 300 in this embodiment are generally rectangular sheet steel that can be solid or perforated for aesthetics and air flow. Alternatively, rather than using a single side panel 300 per side of the network cabinet, multiple side panels could be used on each side and various geometries, materials, and designs could be used depending on the particular application. In addition, rather than side panels, additional doors could also be used on the sides of the cabinet, depending on the application and accessibility desired. In this example, side panels 300 have hooks 305 attached to the bottom inside surface of side panels 300 and latches 315 attached to the top of side panels 300.

To mount the side panels 300, a bar 310 is attached between the front and back door mounts 15 by end brackets 312. The bat 310 is also supported near its center by center bracket 311, which is attached to the front to back base beam 115. As can best be seen in FIGS. 8A and 9, the hooks 305 are placed over the bar 310 to Support the side panel 300 and the side panel 300 is aligned. The side panel 300 is then rotated into a vertical position and the latches 315 secure the side panel 300 to a side flange 202 of the top cover 200. Alternatively, the latches 315 can also have a locking assembly that allows the latches 315 to be locked into position once the side panels 300 hive been mounted.

Figure 7A:
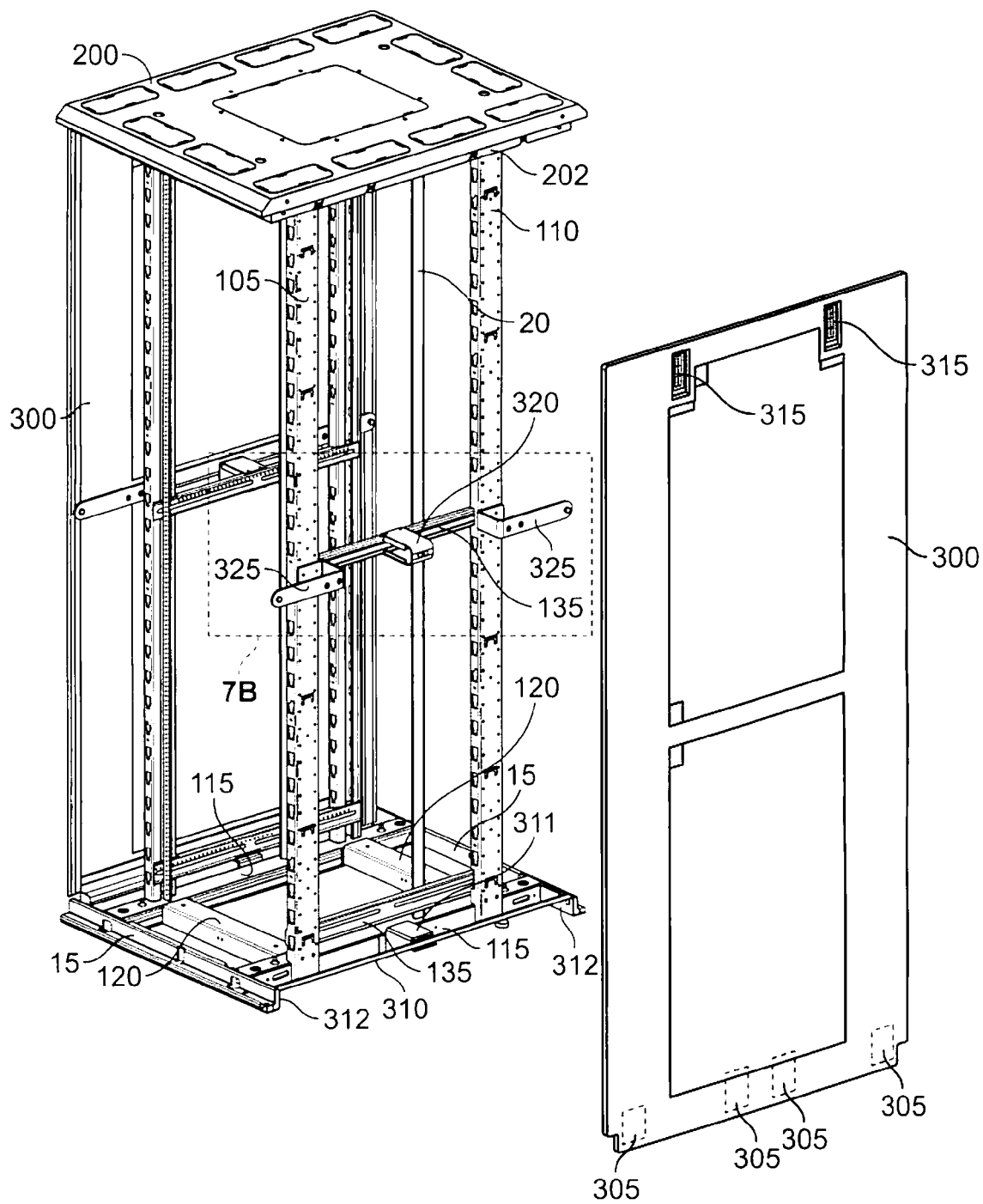
FIG. 7A is an exploded perspective view of the base frame, top cover, and side panels of the network cabinet of the present invention.
Figure 7B:
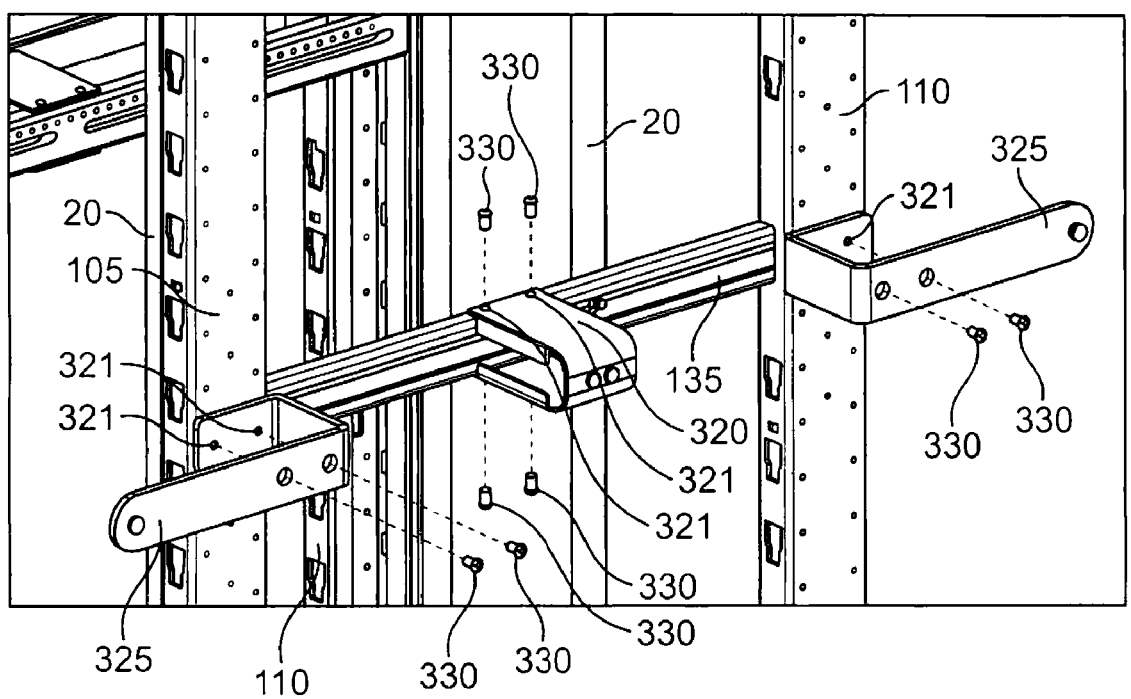
FIG. 7B is an enlarged partial exploded view of the base frame and side panel brackets shown in FIG. 7A.

As can best been seen in FIG. 7B, in this embodiment a center bracket 320 is attached and bonded to the center front to back support beam 135 and side brackets 325 are attached and bonded to a front vertical frame rail 105 and a back vertical frame rail 110. Trilobular screws 330 can be inserted through holes 321 in the brackets 320, 325 and threaded into the front to back support beam 135 and vertical frame rails 105, 110, securing the brackets 320, 325 to the front to back support beam 135 and vertical frame rails 105, 110. The trilobular screws 330 can also be used to bond to the front and back support beam 135 and vertical frame rails 105, 110 by cutting threads into the metal of the front to back support beam 135 and vertical frame rails 105, 110. An area around the holes 321 in the brackets 320, 325 is masked and left unpainted, thereby also bonding the trilobular screws 330 to the brackets 320, 325. Alternatively, rather than masking portions around the holes 321, a trilobular screw having teeth on the underside of the head that will cut into the metal of the brackets 320, 325 can be used if bonding is desired.

In this embodiment, the brackets 320, 325 provide support for the side panels 300 and offset the side panels 300 from the front and back vertical frame rails 105, 110 and front to back support rails 135, thereby providing easily accessible vertical cable management pathways between the side panels 300 and the front and back vertical frame rails 105, 100 and front to back support rails 135. In addition, brackets 325 on each side of bracket 320 provide a guide or channel for placing cables extending in a vertical direction within the cabinet and proximate to the respective corners of the cabinet. Alternatively, brackets 320, 325 could be removed if not needed for a particular application.

Figure 8A:
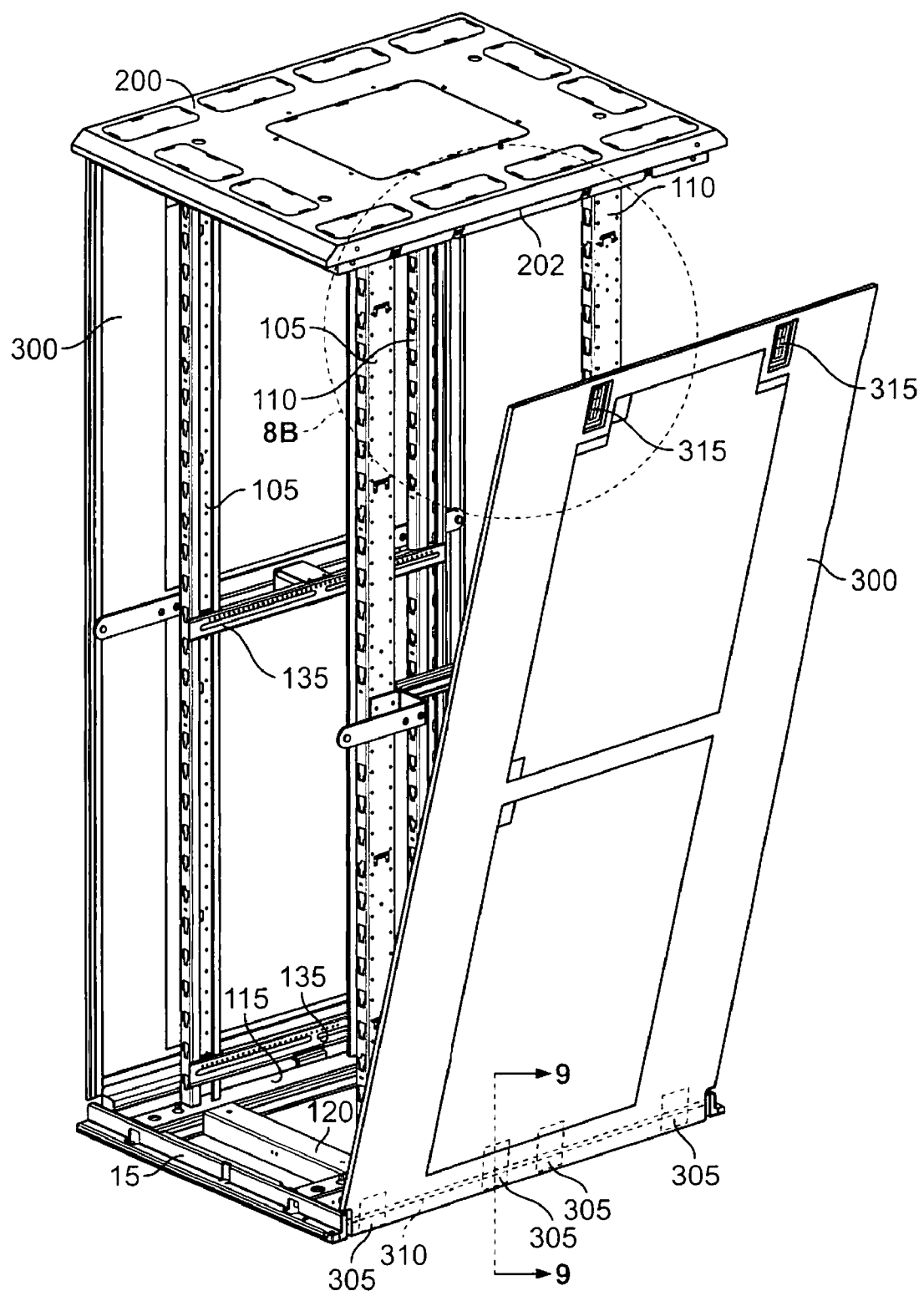
FIG. 8A is a perspective view of the base frame, top cover, and side panels of the network cabinet of the present invention, with one side panel partially installed.
Figure 8B:
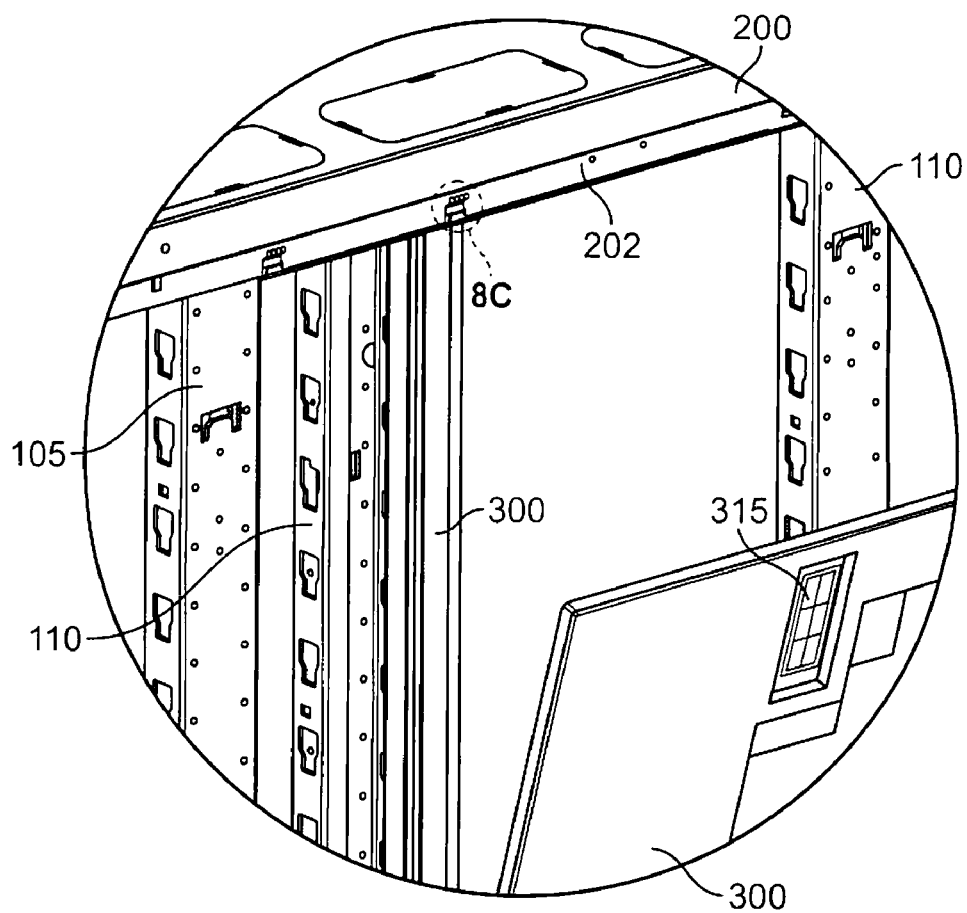
FIG. 8B is an enlarged partial view of the base frame, top cover, and side panel shown in FIG. 8A.
Figure 8C:
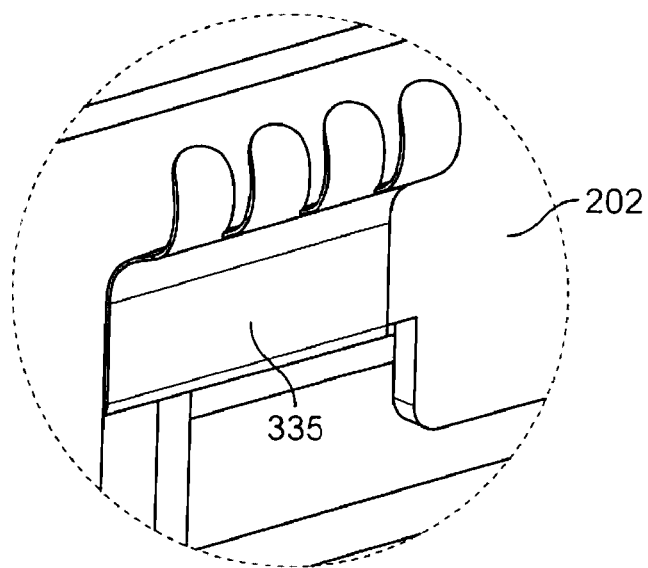
FIG. 8C is an enlarged partial view of the top cover and grounding clip shown in FIG. 8B.
Figure 9:
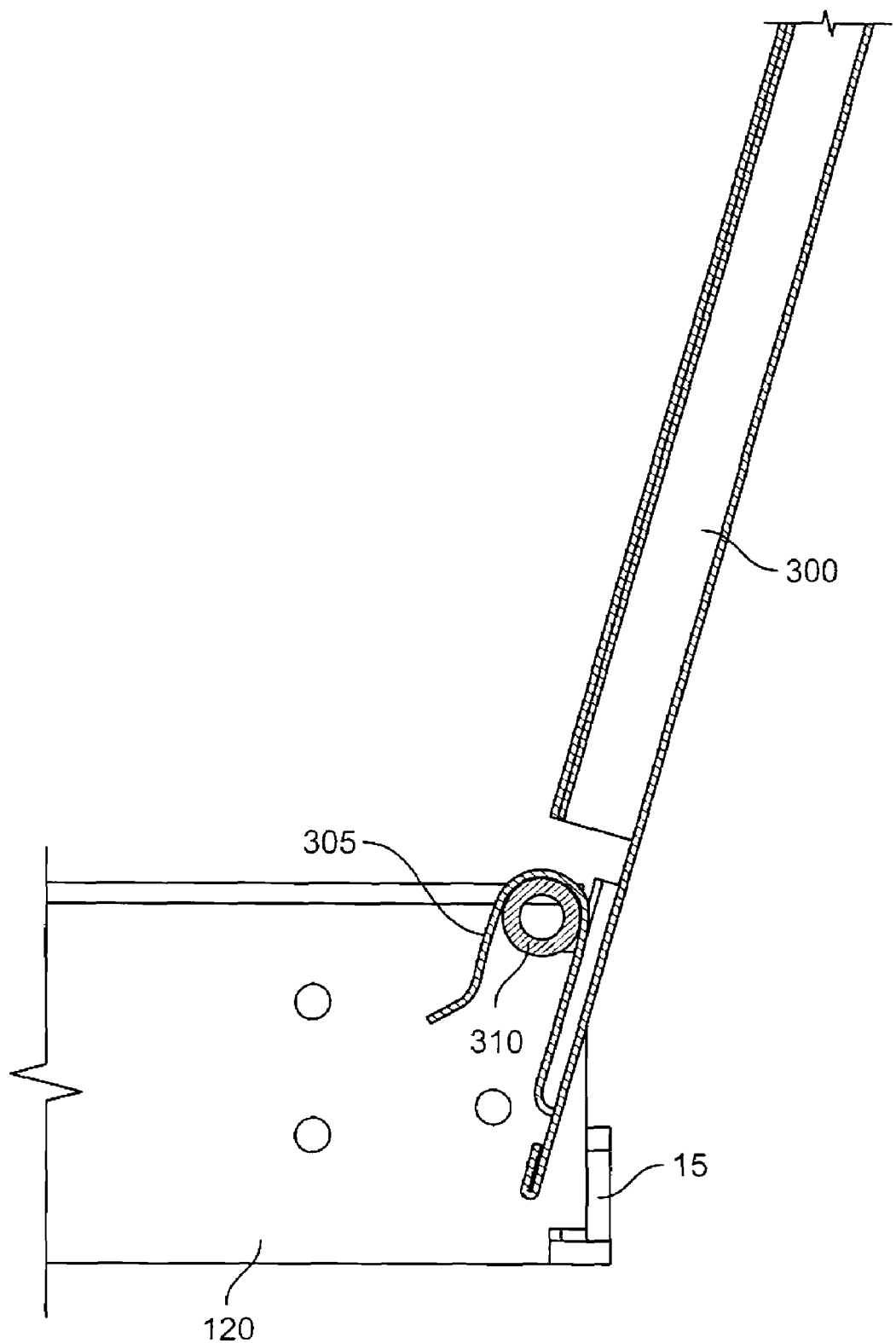
FIG. 9 is a cross-sectional view taken along line 9-9 in FIG. 8A.

Referring to FIGS. 8A. 8B, and 8C, in this embodiment the side panels 300 are bonded to top cover 200 through a grounding clip 335. The grounding clip 335 is attached to a masked, unpainted portion of the side flange 202 of the top cover 200. Each side panel 300 also has a masked, unpainted portion of the inside surface that contacts the grounding clip 335 and compresses the grounding clip 335 once the side panel 300 is latched in place. The contact of the grounding clip 335 with the masked, unpainted portions of the top cover 200 and side panel 300 bonds each side panel 300 to the top cover 200.

Alternatively, rather than using grounding clips 335 to bond the side panels 300 to the top cover 200, the side panels 300 could be bonded to the base frame 100 through the bar 310 and hooks 305. To provide bonding in this manner, one of the end brackets 312, which is welded to the bar 310, would be attached to a door mount 15 so that a bond is created and one of the hooks 305 would be attached to the side panel 300 so that a bond is created, such as by welding or the use of internal tooth lock washers, trilobular screws, paint masking, etc. as described throughout. A bond would then be created between the bar 310 and the bonded hook 305 by paint masking the bar 310 in the area that will contact the hook 305.

Figure 10A:
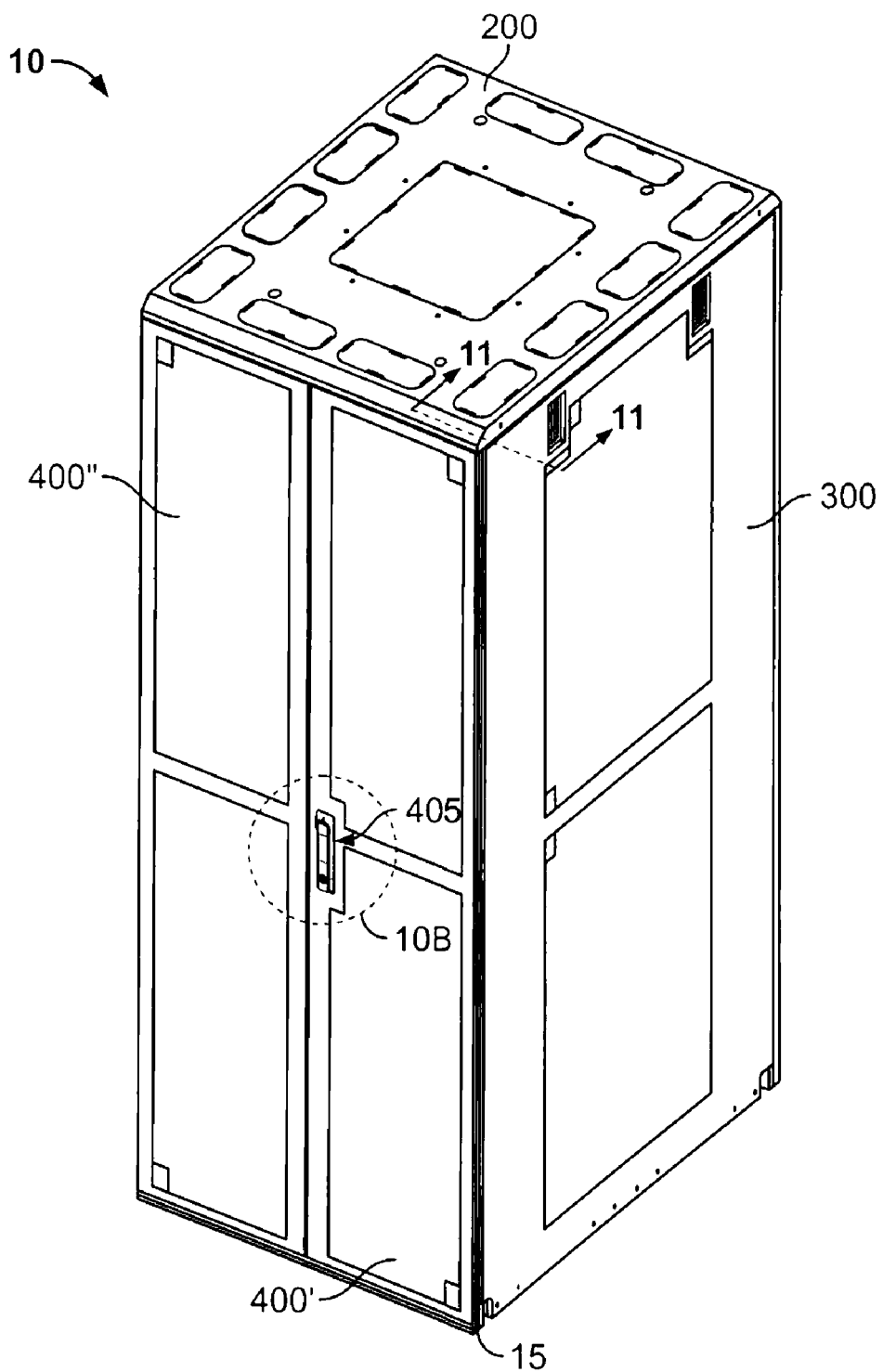
FIG. 10A is a back perspective view of the network cabinet of the present invention.

Referring to FIG. 10A, in this embodiment back doors 400 are mounted to the back of network cabinet 10 between top cover 200 and back door mount 15. In the example shown, back doors 400 are split doors and are generally rectangular sheet steel that can be solid or perforated for aesthetics and air flow. Alternatively, rather than using split doors, a single back door or any other type of door having various geometries and being made of various materials could be used depending on the particular application. Here, each of the back doors 400 hinges open on pins at the top and bottom of the outside corners of back doors 400.

Figure 10B:
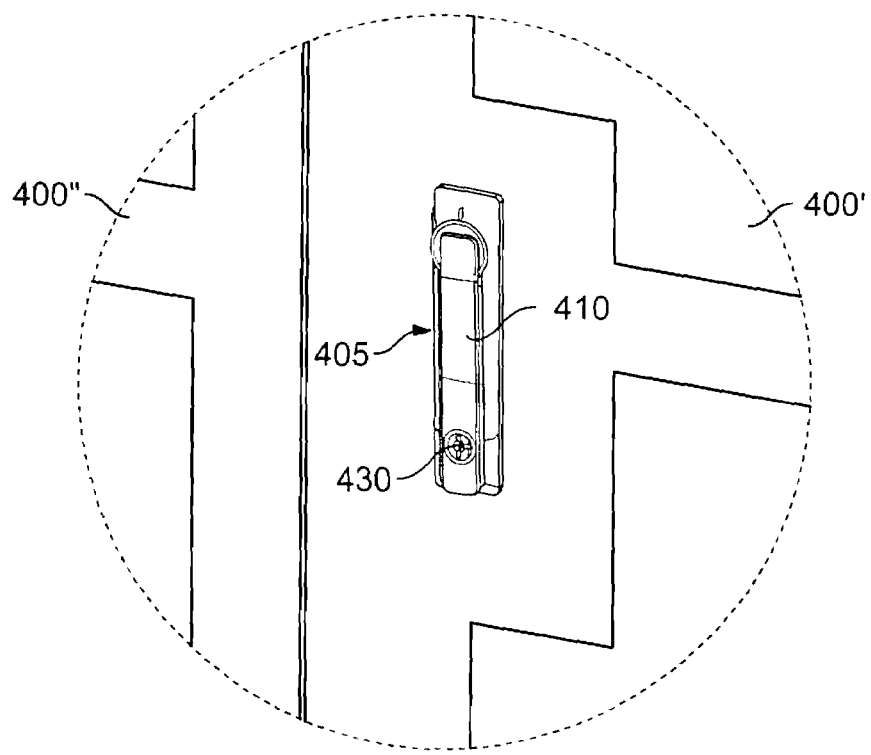
FIG. 10B is an enlarged partial view of the door handle shown in FIG. 10A.
Figure 10C:
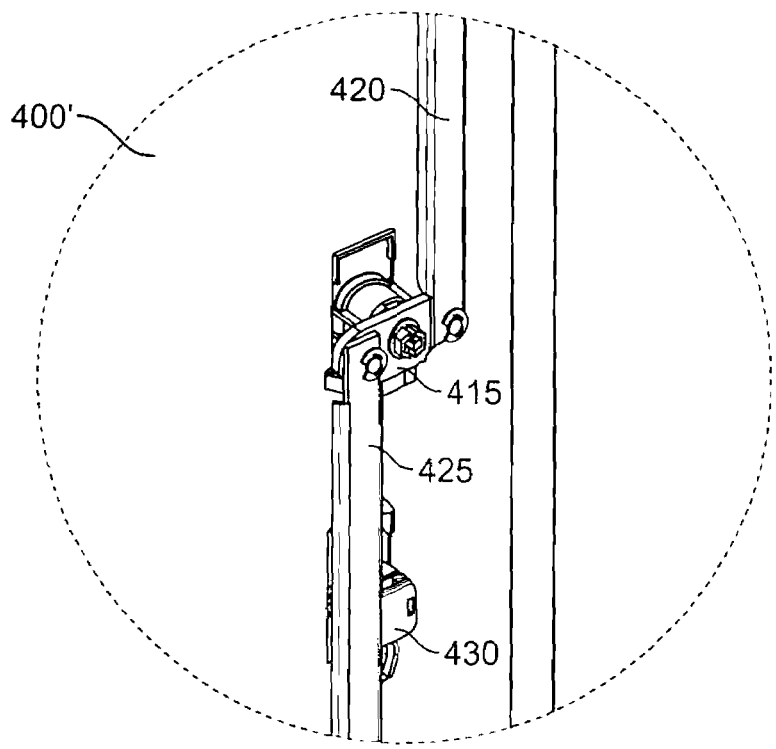
FIG. 10C is an enlarged partial view of the back of the door handle shown in FIG. 10B.

Referring to FIGS. 10A, 10B, and 10C, in the example shown, one of the back doors 400 has a latch mechanism 405 that secures the door to top cover 200 and back door mount 15. Latch mechanism 405 has a door handle 410 that is accessible from the outside of back door 400 and can also have a cylinder lock 430 that can lock door handle 410 in the closed position. On the inside of back door 400', door handle 410 is connected to a cam plate 415 that can rotate as door handle 410 is rotated. An upper rod 420 is attached to one end of cam plate 415 and a lower rod 425 is attached to the other end of cam plate 415, opposite upper rod 420. Upper rod 420 extends generally vertically from cam plate 415 up to top cover 200 and lower rod 425 extends generally vertically from cam plate 415 down to door mount 15. When in the closed position, upper rod 420 extends into a hole in top cover 200 and lower rod 425 extends into a hole in door mount 15, thereby securing the back door closed.

In the example shown in FIGS. 10A, 10B, and 10C, one of the back doors 400' has a latch mechanism 405 and the opposite back door 400" is overlapped by back door 400' with the latch mechanism to hold it in the closed position. Alternatively, rather than overlapping, both back doors 400', 400" could have latch mechanisms 405.

Figure 10D:
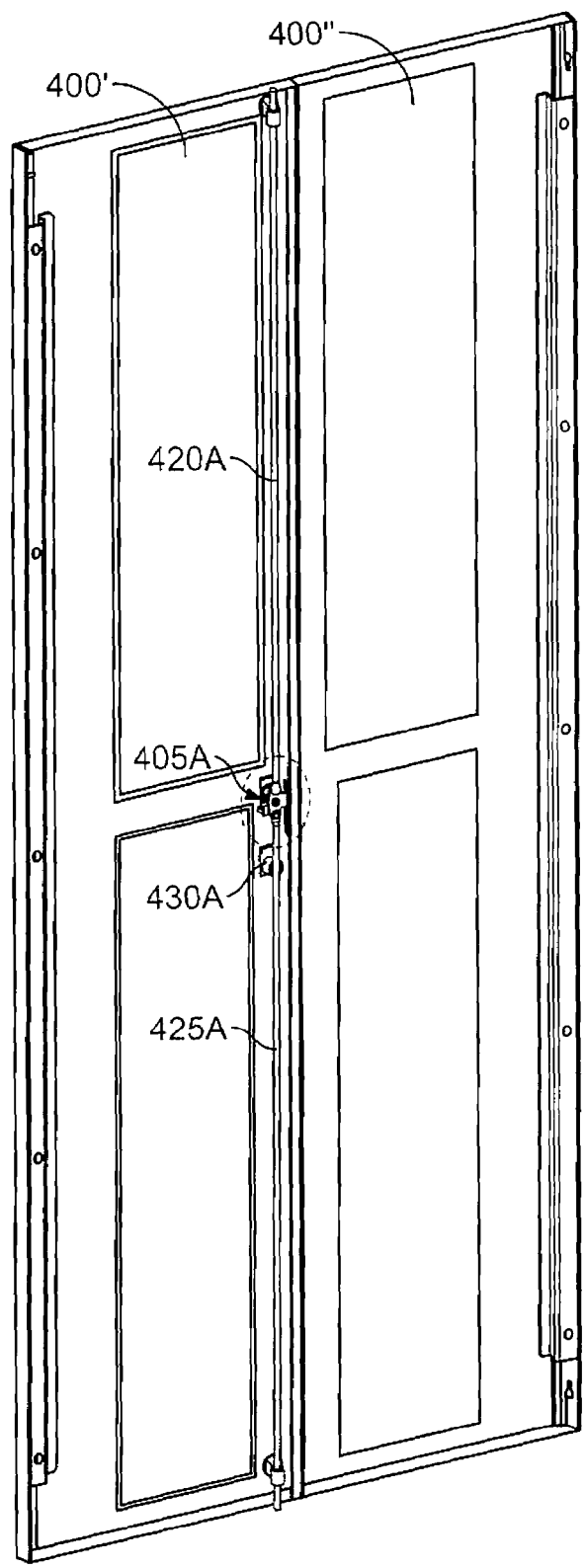
FIG. 10D is a back perspective view of the back doors of the network cabinet of the present invention with an alternative latch mechanism.
Figure 10E:
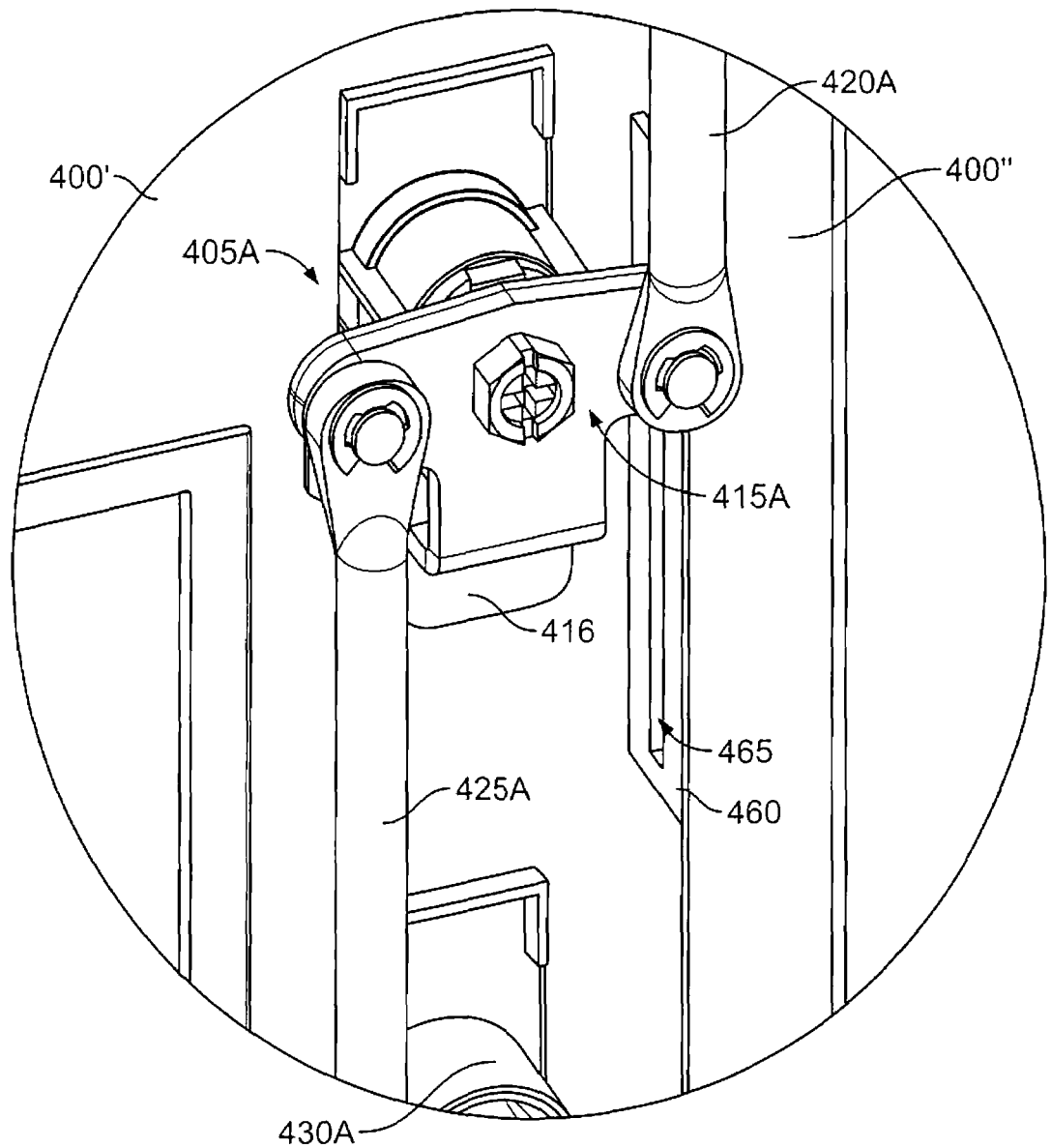
FIG. 10E is an enlarged partial view of the alternative latch mechanism shown in FIG. 10D in the open position.
Figure 10F:
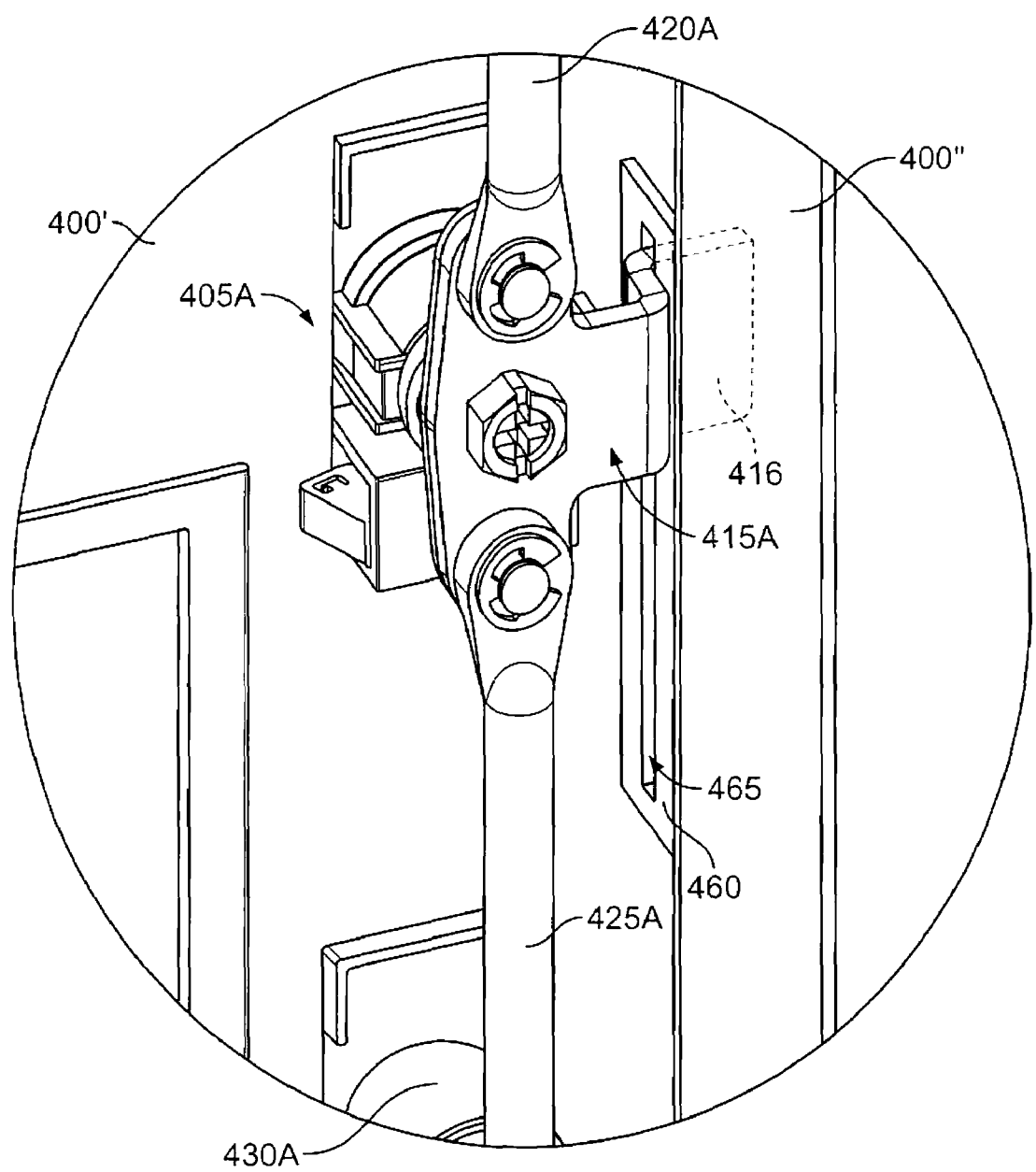
FIG. 10F is an enlarged partial view of the alternative latch mechanism shown in FIG. 10D in the closed position.

In another example, shown in FIGS. 10D, 10E, and 10F, one of the back doors 400' again has a latch mechanism 405A that secures the door to top cover 200 and back door mount 15. Latch mechanism 405A has a door handle (not shown) that is accessible from the outside of back door 400' and can also have a cylinder lock 430A that can lock the door handle in the closed position. On the inside of back door 400', the door handle is connected to a cam plate 415A that can rotate as the door handle is rotated. An upper rod 420A is attached to one end of cam plate 415A and a lower rod 425A is attached to the other end of cam plate 415A, opposite upper rod 420A. Upper rod 420A extends generally vertically from cam plate 415A up to top cover 200 and lower rod 425A extends generally vertically from cam plate 415A down to door mount 15. When in the closed position, upper rod 420A extends into a hole in top cover 200 and lower rod 425A extends into a hole in door mount 15, thereby securing the back door closed.

Referring specifically to FIGS. 10E and 10F, in the example shown, back doors 400', 400" still overlap to hold the second door 400" in the closed position, but also have an additional feature to provide extra security for the second door 400". In the example shown, cam plate 415A has a locking arm 416 that extends outward from and generally perpendicular to the axis of rotation of cam plate 515A and back door 400" has a plate 460 that includes a slot 465, which is configured to receive locking arm 416. Plate 460 can be a separate piece that is attached to back door 400", such as by welding or screws, or plate 460 can be integrally formed with back door 400". In addition, locking arm 416 can be shaped in a stair-step configuration towards back door 400' to move locking arm 416 away from the inside of network cabinet 10, which reduces the risk that locking arm 416 will pinch or catch cables or wiring that are in cabinet 10.

As can be seen in FIG. 10E, when latch mechanism 405A is in an open position, locking arm 416 extends downward and does not engage slot 465 and back doors 400', 400" can be opened. Conversely, as can be seen in FIG. 10F, when latch mechanism 405A is moved to a closed position, locking arm 416 rotates until it is generally horizontal and engages slot 465. When in this position, back door 400" is secured by the overlap of back door 400' over back door 400" and also by the engagement of locking arm 416 with slot 465.

Figure 11:
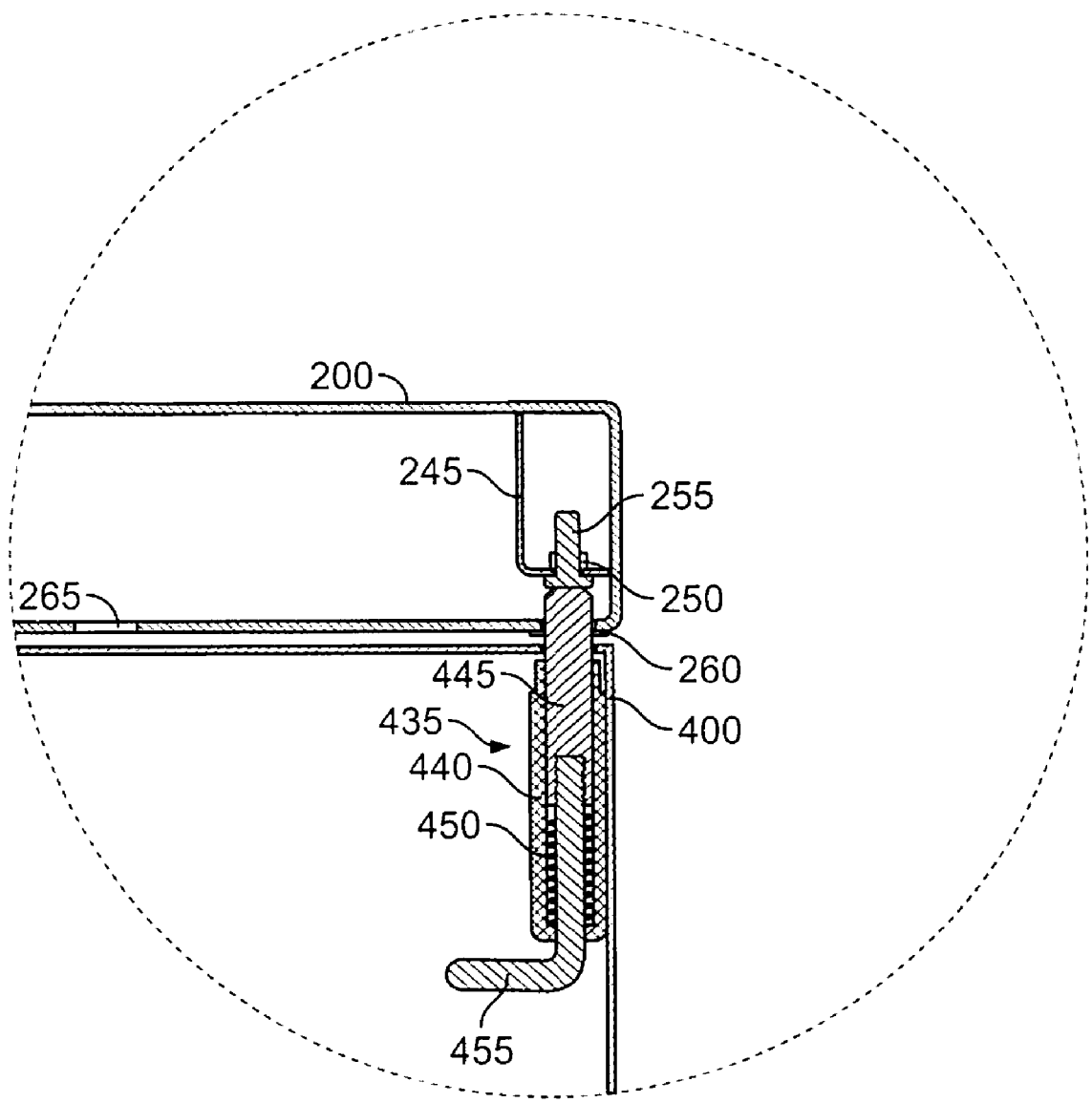
FIG. 11 is a cross-sectional view taken along line 11-11 in FIG. 10A.

Referring to FIG. 11, each of the back doors 400 can be bonded to top cover 200, and therefore to base frame 100, through a spring loaded hinge assembly 435, which includes a generally cylindrical body 440, hinge pin 445, release arm 455, and spring 450. Body 440 is steel, or other conductive material, and is welded to the inside surface of back door 400, which provides an electrical connection between body 440 and back door 400. Hinge pin 445 is steel, or other conductive material, and is positioned inside the body 440. Release arm 455 is generally "L" shaped, extends through a hole in the end of body 440, and threads into hinge pin 445. Spring 450 is generally made of a conductive material and is positioned inside of body 440 and is compressed between hinge pin 445 and the end of body 440. Spring 450 biases hinge pin 445 outward from body 440, allows hinge pin 445 to be retracted when release arm 455 is pulled, and is one way of providing an electrical connection between hinge pin 445 and body 440. Hinge pin 445 extends from the end of body 440, through a hole in the top of back door 400 and through bushing 260 in top cover 200, where hinge pin 445 contacts a thread forming screw 255 that is bonded to top cover 200.

To bond thread forming screw 255 to top cover 200, a conductive ground angle 245 is welded to the inside surface of top cover 200 and thread forming screw 255 is threaded into ground angle 245 and into a nut 250 that is welded to ground angle 245, thereby providing a bond between top cover 200 and screw 255.

To install or remove back door 400, release arm 455 is pulled downward, which compresses spring 450 and retracts hinge pin 445 into body 440. With hinge pin 445 below the level of bushing 260, back door 400 can be placed in position or removed. Once back door 400 is in position, release arm 455 is released and spring 450 pushes hinge pin 445 outward through bushing 260 until hinge pin 445 contacts screw 255.

In this example, spring loaded hinge assembly 435 provides the hinge mechanism for back door 400 and also provides a positive grounding path when back doors 400 are installed. This allows the removal of back doors 400 without the need of disconnecting any grounding jumper wires.

Referring to FIGS. 2A and 2B, in this example door mounts 15 also have holes 18 that are inset from bushings 600 that receive the bottom fixed hinge pin for back doors 300. Although FIGS. 2A and 2B show door mount 15 for front door 500, the two door mounts 15 are mirror images of each other and door mount 15 for back doors 400 contain identical holes 18. Referring to FIGS. 4A, 4B, and 11, top cover 200 has holes 265 that are inset from bushings 260 that receive hinge pin 445 of spring loaded hinge mechanism 435. Each of the holes 18 in door mounts 15 is aligned in a generally vertical axis with a corresponding hole 265 in top cover 200 and provide a storage mechanism for a back door 400 that has been removed.

For example, as described above, a back door 400 can be removed by pulling downward on release arm 455, which retracts hinge pin 445 and allows back door 400 to be tilted and removed. Rather than having to lean the removed back door 400 on cabinet 10 or against a wall or other equipment where it can be bumped into or knocked over, the removed back door 400 can be stored using holes 18 and 265 in door mount 15 and top cover 200. To store the removed back door 400, the opposite back door is opened, the fixed hinge pin on the bottom of the removed back door 400 is inserted into hole 18 in door mount 15 nearest bushing 600 of the open back door, and hinge pin 445 of spring loaded hinge mechanism 435 is inserted into the corresponding hole 265 in top cover 200 by pulling downward on release arm 455.

Figure 12A:
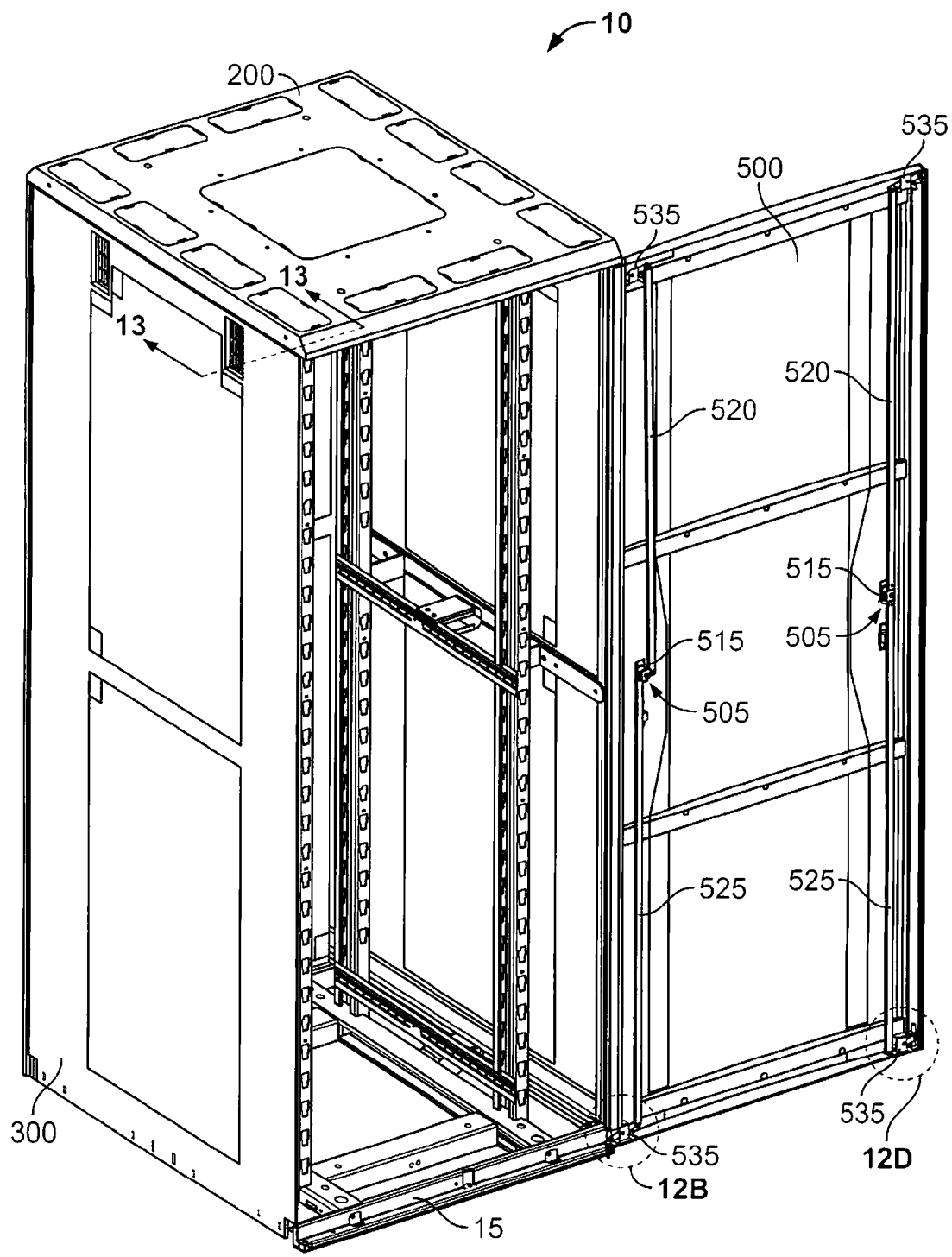
FIG. 12A is a front perspective view of the network cabinet of the present invention with the front door partially open.

Referring to FIG. 12A, in this embodiment front door 500 is mounted to the front of network cabinet 10 between top cover 200 and front door mount 15. In the example shown, front door 500 is generally rectangular sheet steel that can be solid or perforated for aesthetics and air flow, is dual hinged with retractable hinges, as described in more detail below, and can be opened from either the left or right side giving full access to either the left or right rack and vertical cable management channels without having to remove front door 500. Alternatively, rather than using a single dual hinged door, split doors, a single hinged door, or any other type of door could be used as well and front door 500 could be made of any geometry and of any material and design as required for a particular application.

Figure 19:
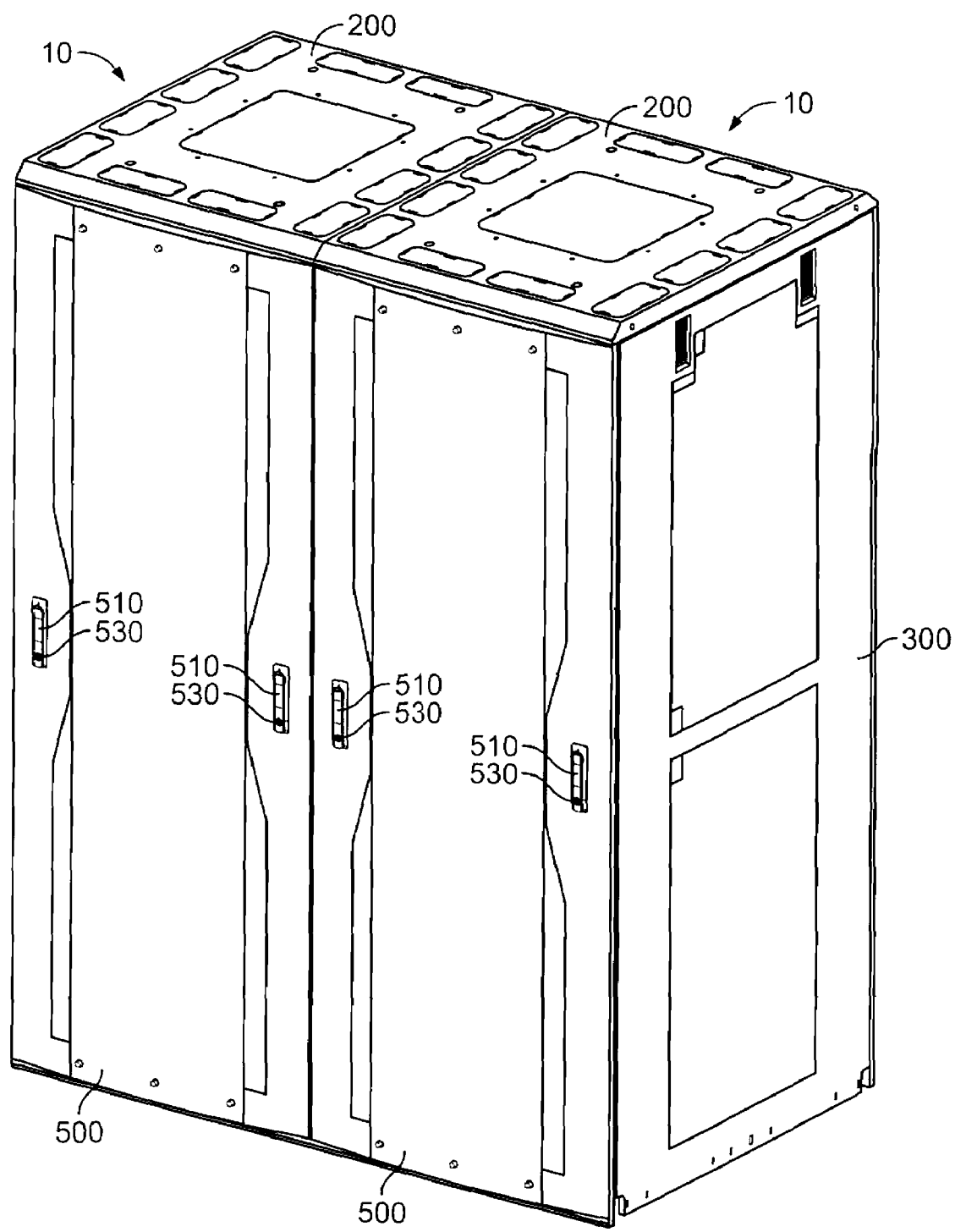
FIG. 19 is a front perspective view of two network cabinets ganged together.

Referring to FIG. 12A, in this example, front door 500 has two latch mechanisms 505, one on each side of front door 500, that operate independently of each other. Latch mechanisms 505 have a door handle 510 (as shown in FIG. 19), cam plate 515, upper rod 520, and lower rod 525, and are substantially identical in operation to latch mechanism 405 described above for back doors 400 (see FIGS. 10B and 10C). Latch mechanisms 505 can also have a cylinder lock 530 (as shown in FIG. 19), which can lock door handle 510 in the closed position.

Figure 12B:
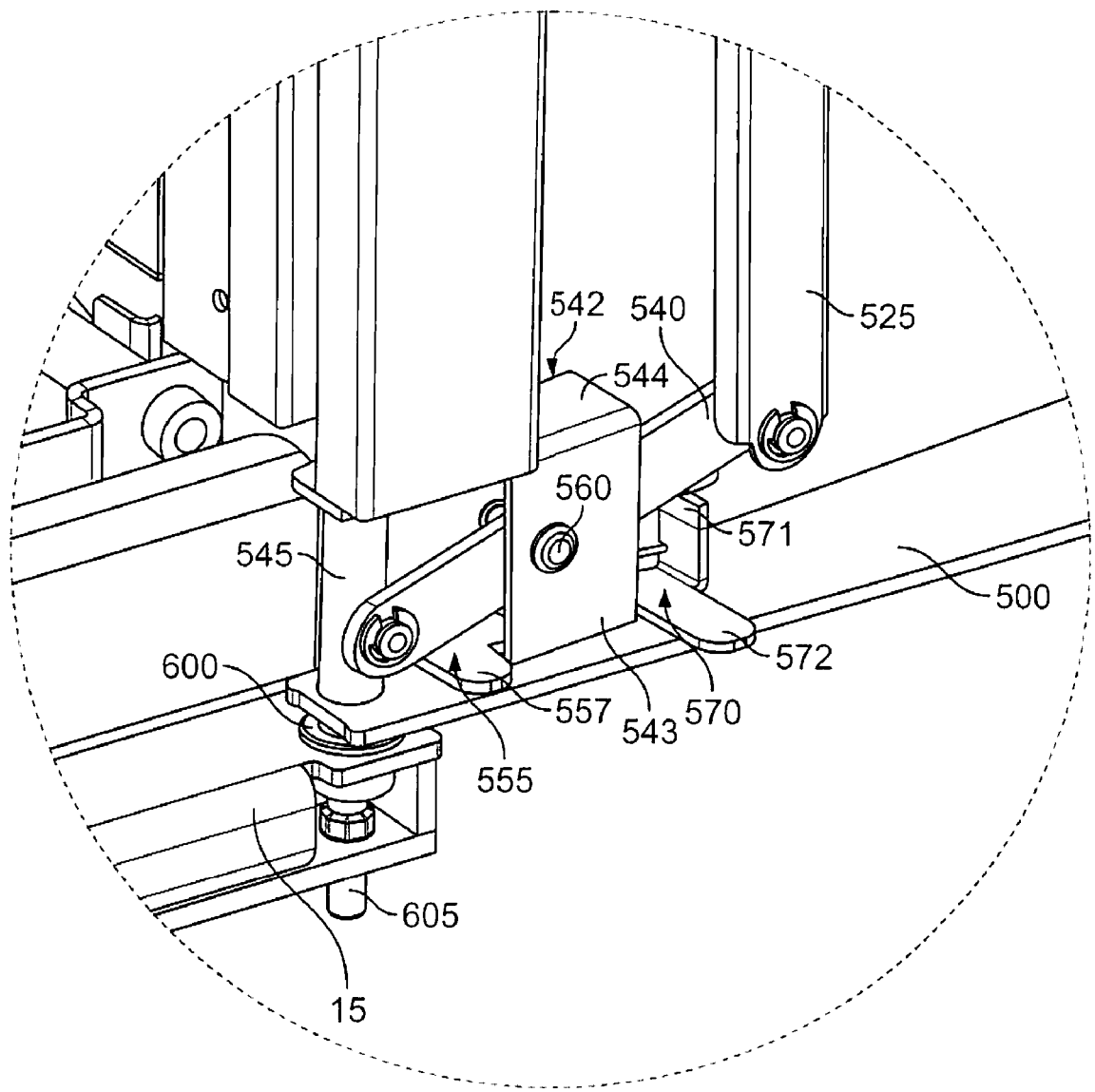
FIG. 12B is an enlarged partial view of a safety hinge of the front door shown in FIG. 12A.
Figure 12C:
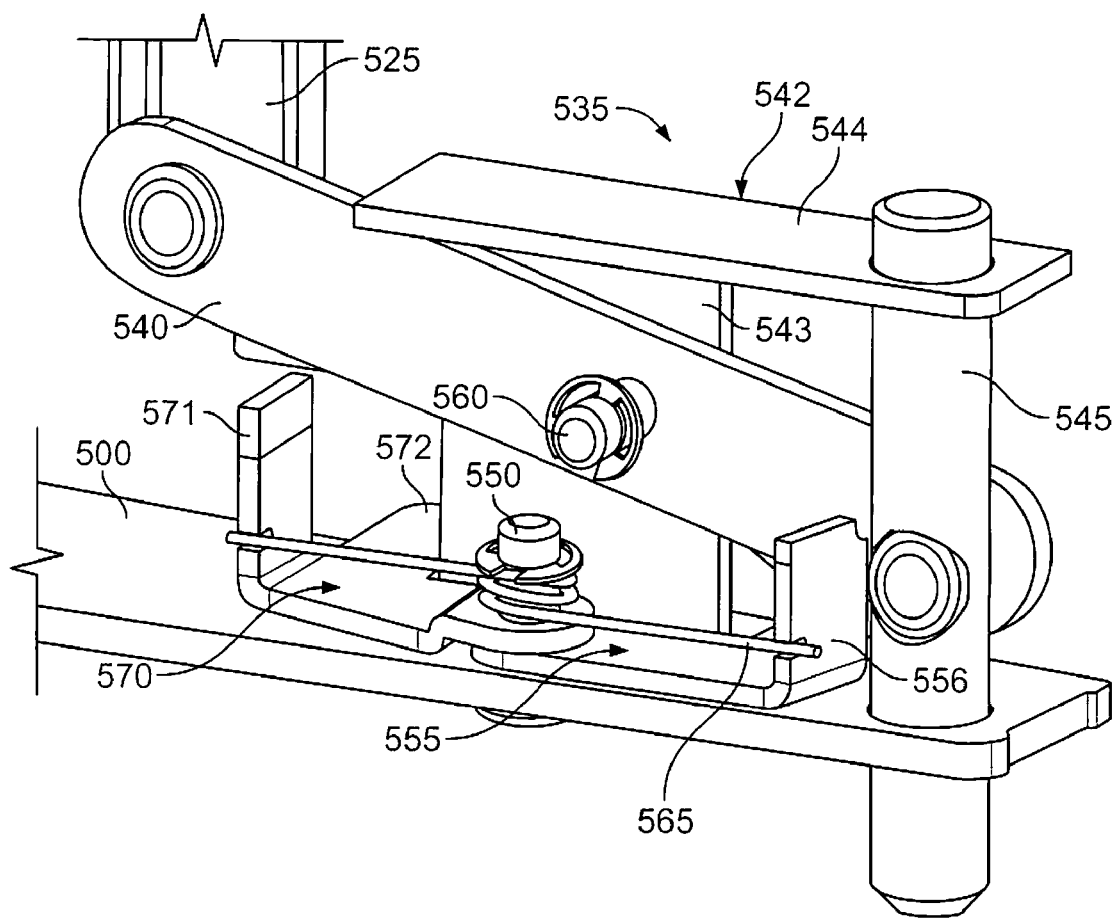
FIG. 12C is a back view of the safety hinge in FIG. 12B.
Figure 12D:
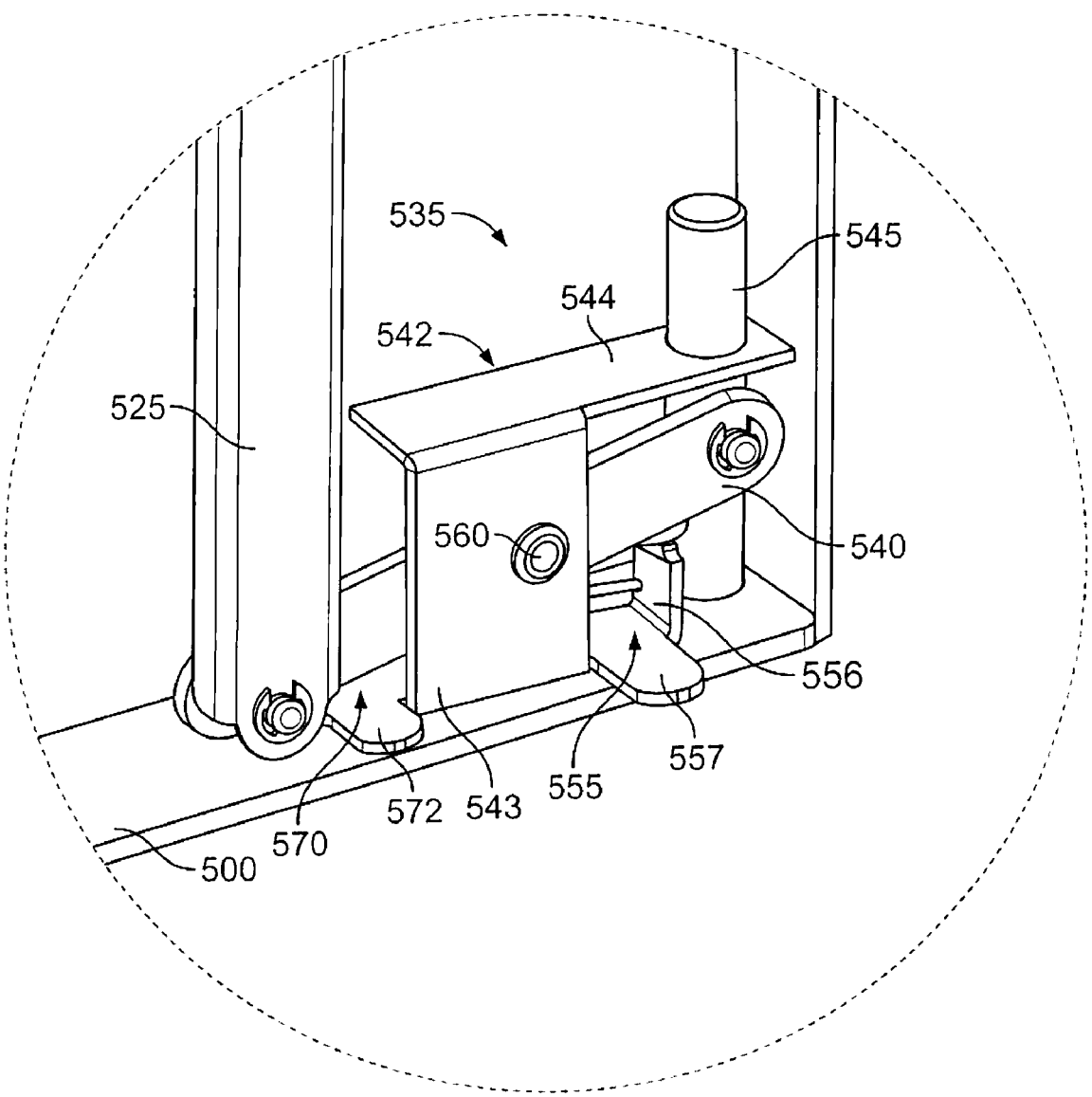
FIG. 12D is an enlarged partial view of a second safety hinge of the front door shown in FIG. 12A.

Referring to FIG. 12A, at each top and bottom corner of front door 500 (four positions total) is a locking hinge assembly 535. FIGS. 12B and 12D show locking hinge assemblies 535 on the bottom corners of front door 500 and it will be understood that the assemblies on the top corners are identical to those described herein for the bottom corners. FIG. 12C shows the backside of the locking hinge assembly shown in FIG. 12B. Each locking hinge assembly 535 includes a hinge assembly, which includes hinge lever 540, hinge support 542, and hinge pin 545, and a blocking assembly, which includes inner lever stop 555 and outer lever stop 570. As used herein, inner lever stop 555 is the lever stop that is closest to hinge pin 545 and outer lever stop 570 is the lever stop that is furthest from hinge pin 545.

Hinge support 542 has a generally vertical wall 543 that is attached to front door 500, such as by welding, with screws, etc., and a generally horizontal wall 544 that extends generally perpendicular from the top of vertical wall 543. Hinge lever 540 is mounted to vertical wall 543 of hinge support 542 by pin 560 such that lever arm 540 can rotate about pin 560. Hinge lever 540 is also rotatably connected to a lower rod 525 (or upper rod 520 depending on which locking hinge assembly) at one end and to hinge pin 545 at the end opposite lower rod 525. Hinge pin 545 extends generally vertically through front door 500 and through horizontal wall 544.

A lever stop hinge pin 550, as seen in FIG. 12C, is attached to front door 500 and lever stops 555, 570 are mounted onto lever stop hinge pin 550 such that lever stops 555, 570 can rotate about hinge pin 550. Each lever stop 555, 570 has a generally vertical stop arm 556, 571 and a generally horizontal release arm 557, 572. A torsion spring 565, or other resilient member, is mounted on lever stop hinge pin 565 and has ends that extend out to stop arms 556, 571 of lever stops 555, 570 to bias lever stops 555, 570 into a forward position.

In operation, when front door 500 is closed (the closed position is defined as both top corners of front door 500 seated against top cover 200 and both bottom corners of front door 500 seated against door mount 15) upper and lower rods 520, 525 are pulled towards the center of front door 500, thereby rotating lever arms 540 and extending hinge pins 545 into their corresponding bushings 600 in door mount 15 or top cover 200. Therefore, hinge pins 545 in each of the four corners of front door 500 engage bushings 600 in door mount 15 or top cover 200 and front door 500 is (fully secured. In addition, when in the closed position, door mount 15 or top cover 200 will push against release arms 557, 572 of both lever stops 555, 570, thereby moving stop arms 556, 571 of both lever stops 555, 570 out of the path of rotation of hinge lever 540. This allows hinge lever 540 to rotate freely in either direction. Referring specifically to FIG. 12B, when a door handle is rotated from a closed to an open position lower rod 525 is lowered, hinge lever 540 is rotated about pin 560, and hinge pin 545 is retracted. This enables front door 500 to be hinged open about hinge pins 545 on the opposite side, which remain extended. Conversely, when lower rod 525 is raised (e.g. the door handle is moved from an open to a closed position), hinge lever 540 will rotate about pin 560 and extend hinge pin 545.

Referring specifically to FIGS. 12B and 12D, operation of locking hinge assemblies 535 is shown when the left side of the front door is unlocked and the front door is opened from left to right (as seen when facing the front of network cabinet 10), as shown in FIG. 12A. FIG. 12B shows the operation of locking hinge assemblies 535 on the side of front door 500 that remains engaged (hinge pins 545 extended), and FIG. 12D shows the operation of locking hinge assemblies 535 on the side of front door 500 that is disengaged (hinge pins 545 retracted).

Referring to FIG. 12B, when front door 500 is moved from the closed position door mount 15 no longer pushes against release arms 557, 572 of lever stops 555, 570 and torsion spring 565 attempts to push lever stops 555, 570 into a forward position. Because hinge lever 540 is still in the locked position, inner lever stop 555 is blocked by hinge lever 540 and cannot rotate forward. However, outer lever stop 570 is not obstructed by hinge lever 540 and is pushed into a forward position by torsion spring 565. When outer lever stop 570 is in the forward position, stop arm 571 is positioned underneath hinge lever 540, thereby preventing hinge lever 540 from rotating. Therefore, in this position, if a user were to attempt to turn the door handle (attempting to move lower rod 525 downward) stop arm 571 prevents hinge lever 540 from moving, thereby preventing the door handle from being moved. This prevents an engaged hinge from being accidentally disengaged if the opposing hinge is disengaged and front door 500 is open. Should this accidental disengagement not be prevented, front door 500 could easily fall onto and injure a person positioned in front of network cabinet 10.

Referring to FIG. 12D, to move front door 500 from the closed position locking hinge mechanisms 535 on the side to be opened must be disengaged. When a user turns the door handle lower rod 525 is pushed down, which rotates hinge lever 540 and pulls back hinge pin 545. After locking hinge mechanisms 535 have been disengaged and front door 500 is moved from the closed position, door mount 15 no longer pushes against release arms 557, 572 of lever stops 555, 570 and torsion spring 565 attempts to push lever stops 555, 570 into a forward position. Because hinge lever 540 has been moved from the locked position, outer lever stop 570 is blocked by hinge lever 540 and cannot rotate forward. However, inner lever stop 555 is not obstructed by hinge lever 540 and is pushed into a forward position by torsion spring 565. When inner lever stop 555 is in the forward position, stop arm 556 is positioned underneath hinge lever 540, thereby preventing hinge lever 540 from rotating. Therefore, in this position, if a user were to attempt to turn the door handle (attempting to move lower rod 525 upward) stop arm 557 prevents hinge lever 540 from moving, thereby preventing the door handle from being moved. This prevents the closing of the door handle until front door 500 is in the fully closed position such that lever stop 555 has been pushed backward thereby unobstructing hinge lever 540 allowing hinge pin 545 to be lowered through and fully engage bushing 600.

As can be seen from the above description, locking hinge assemblies 535 require that front door 500 be in a closed position before the user can change the state of front door 500 (e.g. engage or disengage locking hinge assemblies 535). This accomplishes two important goals: (1) it prevents unexpected and accidental removal of front door 500 (when one side is open, the other side is locked and cannot be disengaged until front door 500 is closed); and (2) it prevents a user from mistakenly thinking that front door 500 is closed when it is still ajar (the door handle cannot be moved into the closed position until front door 500 is completely closed and the lever stops allow movement of the hinge lever).

To remove front door 500, front door 500 is first placed in the closed position. In this position all of the inner and outer lever stops 555, 570 of all locking hinge assemblies 535 are pushed into a retracted position allowing all hinge levers 540 to move freely. While in the closed position, both of the door handles are turned which will disengage all locking hinge assemblies 535 by extending upper and lower rods 520, 525 and retracting hinge pins 545 from their respective bushings 260, 600, allowing removal of front door 500. Once front door 500 has been removed, inner lever stops 555 are moved into their forward position by torsion spring 565, thereby obstructing hinge lever 540 and preventing the door handles from being turned. To install front door 500, the above process is reversed. Front door 500 is placed against door mount 15 and top cover 200 such that hinge pins 545 are aligned with their respective bushings 260, 600. In this position, door mount 15 and top cover 200 will push inner lever stops 555 backwards and out of the way of hinge lever 540, thereby allowing hinge lever 540 to move freely. Both of the door handles are then turned to retract upper and lower rods 520, 525 and thereby extend hinge pins 545 into their respective bushings 260, 600.

Figure 12E:
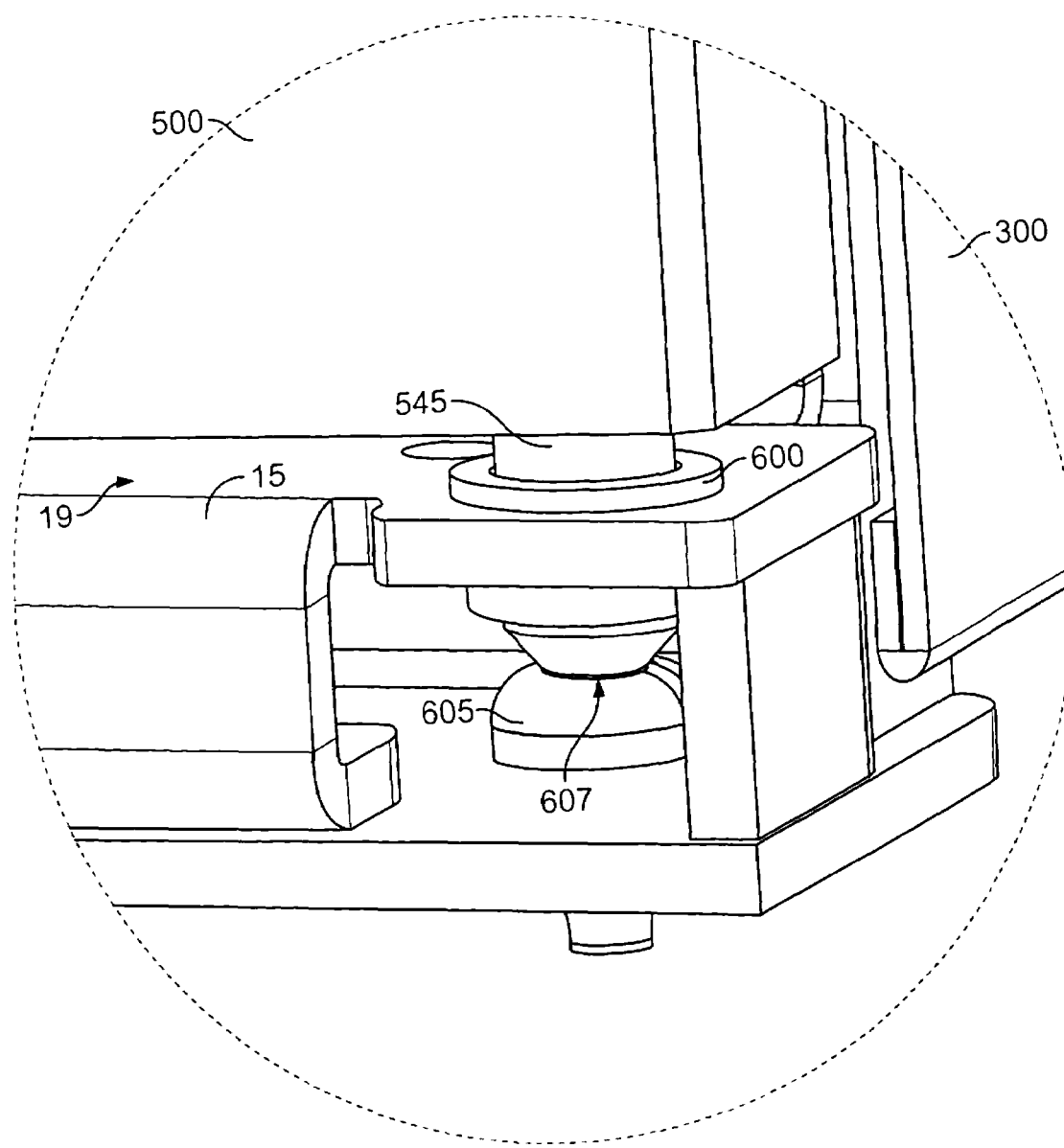
FIG. 12E is an enlarged partial view of a front door lifting mechanism of the front door shown in FIG. 12A.

Referring to FIG. 12E, the engagement between hinge pin 545 of front door 500 and door mount 15 on one side of front door 500 is shown and it will be understood that the engagement between the hinge pin 545 and door mount 15 on the opposite lateral side of front door 500 will be the same. Hinge pin 545 extends through and engages a bushing 600 that is positioned in a hole in the top of door mount 15. In this example, a lifting screw 605 is aligned with hinge pin 545, is threaded into the bottom portion of door mount 15 just below bushing 600 that engages hinge pin 545, and provides bearing surface 607 that contacts the bottom of hinge pin 545 and provides a surface for hinge pin 545 to ride on. As the door handle is moved into the closed position, hinge pin 545 moves down through bushing 600 and contacts bearing surface 607 of lifting screw 605. Hinge pin 545 continues to move downward and lifts front door 500 off of bushing 600 when hinge pin 545 is in the fully extended position. Therefore, front door 500 is elevated and rides on hinge pin 545 rather than bushing 600, which provides clearance between front door 500 and threshold 19 of door mount 15 when closing front door 500 and compensates for door sag and/or worst case tolerance stack-ups. In addition, the elevation of lifting screw 605 can be adjusted to adjust the rise of front door 500 over threshold 19 of door mount 15. Alternatively, rather than using a lifting screw, a bushing that is aligned with hinge pin 545 and has a bearing surface that contacts hinge pin 545 can be inserted into a hole in the bottom portion of door mount 15 to elevate front door 500. Furthermore, rather than the use of a lifting screw or bushing, door mount 15 could be designed such that it provides the bearing surface. For example, the bottom portion of door mount 15 could be formed at such a height that the upper surface of the bottom portion provides the bearing surface that contacts hinge pin 545 and raises front door 500.

In the example described above, with the weight of front door 500 riding on hinge pins 545 (rather than on bushings 600), there is a constant force on bottom hinge pins 545 attempting to push hinge pins 545 into a retracted position. If door handle 510 is not fully engaged when front door 500 is in the closed position, the force on hinge pins 545 could cause door handle 510 to rotate towards an open position and possibly disengage locking hinge assemblies 535. To prevent this from happening an overcam latch mechanism can be used.

Figure 12F:
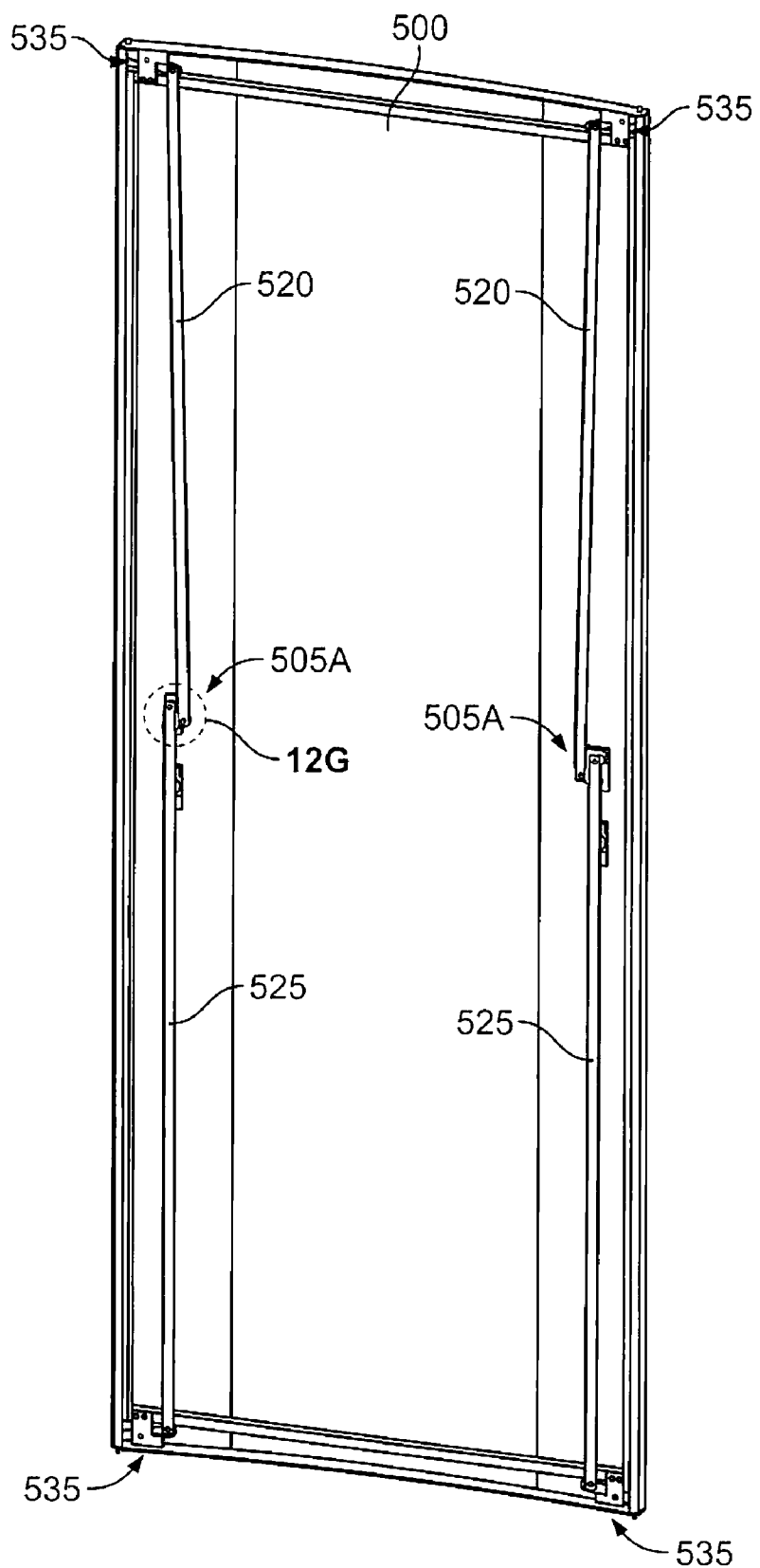
FIG. 12F is a back perspective view of the front door of the network cabinet shown in FIG. 12A with an alternative latch mechanism.
Figure 12G:
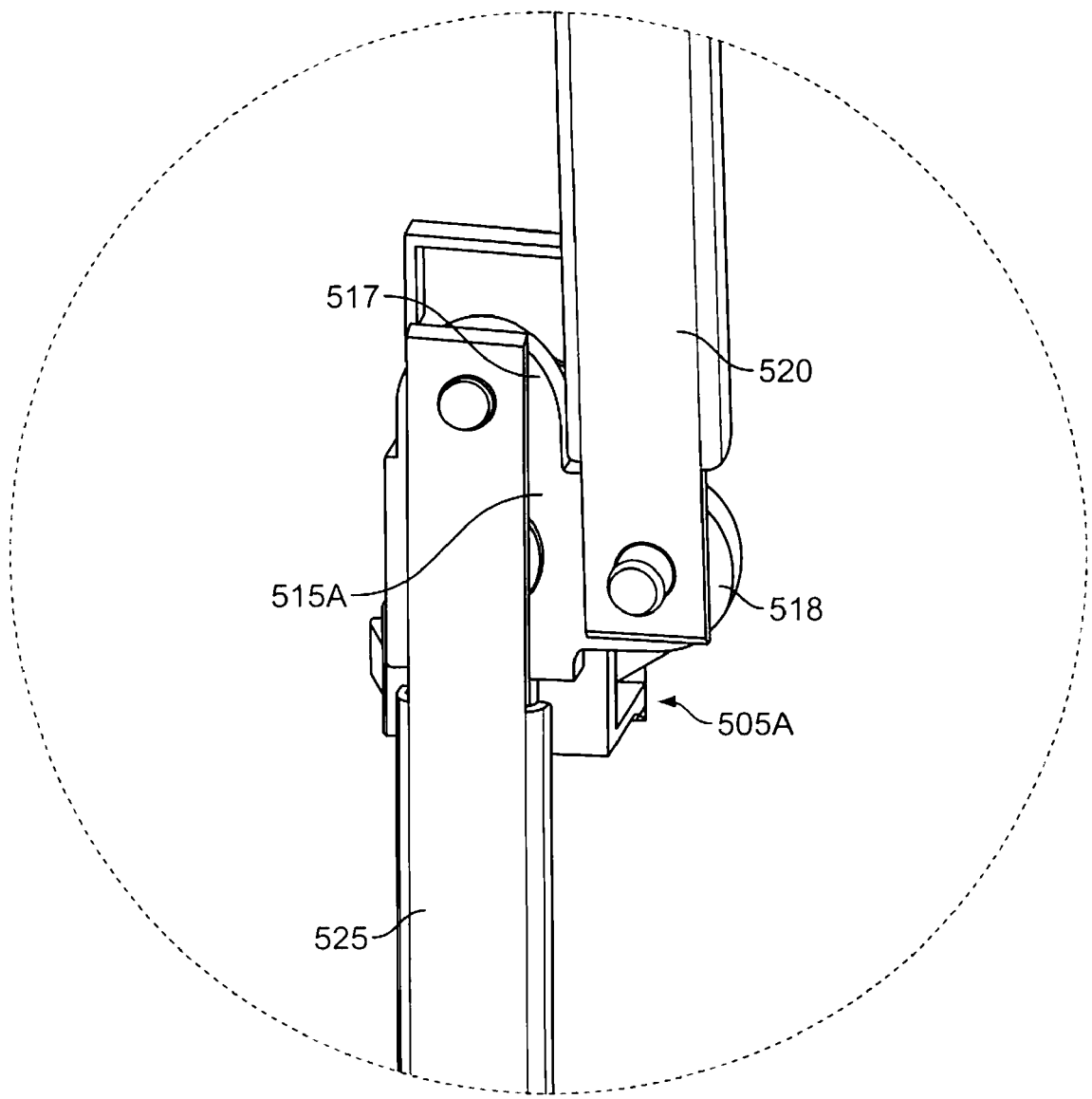
FIG. 12G is an enlarged partial view of the alternative latch mechanism of the front door shown in FIG. 12F.

Referring to FIGS. 12F and 12G, overcam latch mechanism 505A is substantially identical to latch mechanisms 505 described above in that it has a door handle (not shown), a cam plate 515A connected to the door handle such that the door handle and cam plate 515A rotate together about an axis of rotation, and upper and lower rods 520, 525 that are rotatably connected to lobes of cam plate 515A such that they each rotate about axes of rotation. The main difference between latch mechanism 505 and latch mechanism 505A is the design of cam plate 515A. Cam plate 515 in latch mechanism 505 has lobes that are aligned and extend outward from the axis of rotation of cam plate 515 and the door handle. Conversely, cam plate 515A in overcam latch mechanism 505A has lobes 517, 518 that are generally perpendicular to each other and extend outward from the axis of rotation of cam plate 515A and the door handle.

As can best be seen in FIG. 12G, when front door 500 and the door handle are in the closed position and locking hinge assemblies 535 are engaged, the lobe 517 that is connected to lower rod 525 (and therefore bottom hinge pin 545) is extending substantially vertically and the lobe 518 that is connected to upper rod 520 (and therefore upper hinge pin 545) is extending substantially horizontally. In operation, a force exerted on lower hinge pin 545 that attempts to retract hinge pin 545 (such as the weight of front door 500 riding on hinge pin 545) will place a downward force on lower rod 525. However, since lobe 517 is oriented vertically, this downward force on lower rod 525 will not cause cam plate 515A (and therefore the door handle) to rotate. In order to rotate the door handle and cam plate 515A, a positive rotational force must be placed on the door handle to move the door handle into an open position and move lobe 517 from a vertical position to a horizontal position and lobe 518 from a horizontal position to a vertical position. This design prevents cam plate 515A and door handle from rotating due to the force exerted by the weight of front door 500 on lower hinge pin 545.

Figure 13:
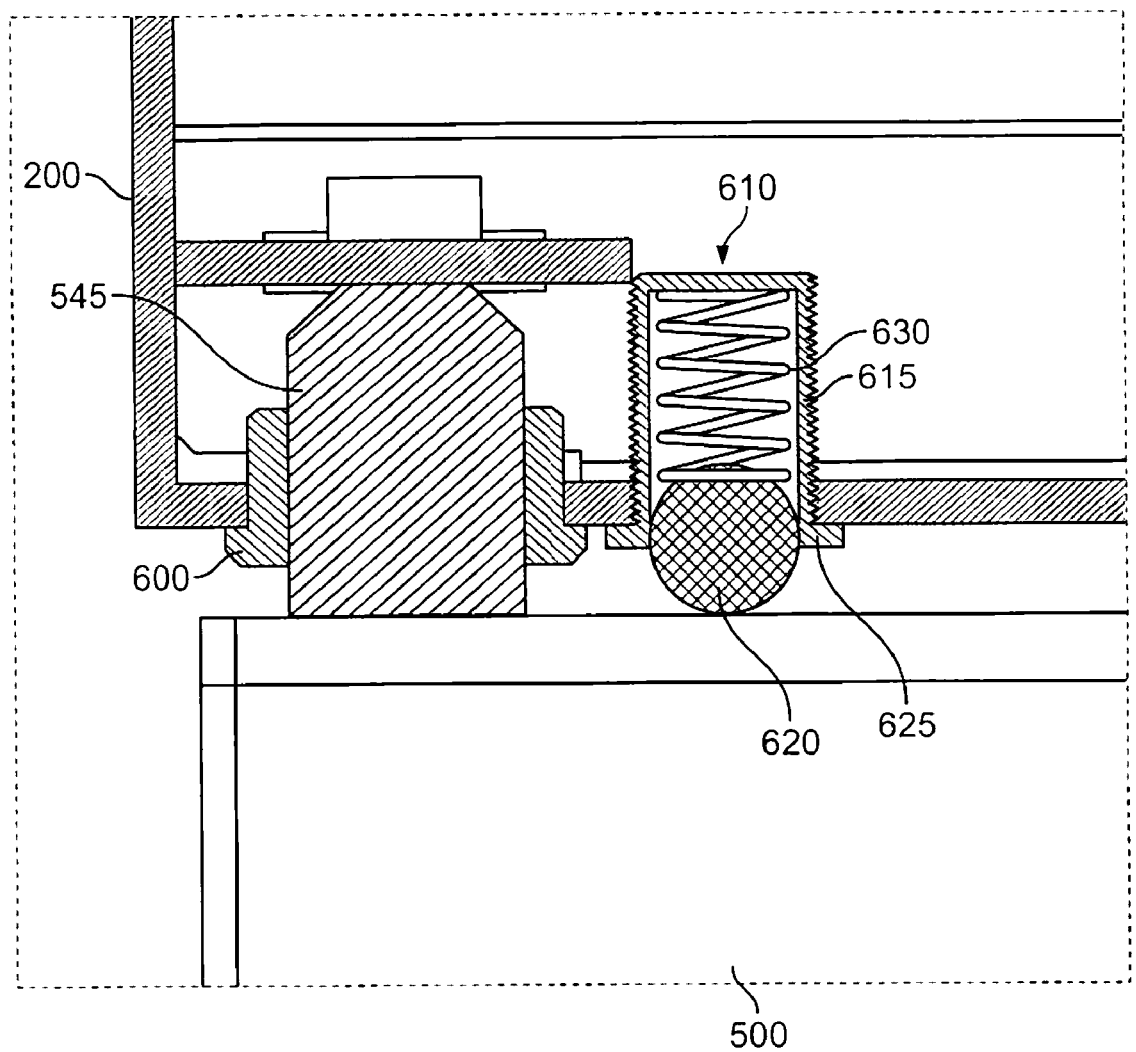
FIG. 13 is a cross-sectional view taken along line 13-13 in FIG. 12A.

Referring to FIG. 13, in this embodiment front door 500 is also bonded to top cover 200 by spring loaded bearing assemblies 610. Two spring loaded bearing assemblies 610 are positioned one at opposite corners of top cover 200, one near each bushing 600 and hinge pin 545. In positioning spring loaded bearing assembly 610 near hinge pin 545, bearing assembly 610 maintains contact with front door 500 as front door 500 is swung to an open position. By using two bearing assemblies 610, front door 500 stays bonded to top cover 200 when closed, open to the left, or open to the right. Each spring loaded bearing assembly 610 has a generally cylindrical body 615, a ball bearing 620, a face plate 625, and a spring 630. Body 615 is steel or another conductive material and has external threads that permit body 615 to be screwed into paint masked compatible threads in top cover 200 until steel face plate 625 is flush with top cover 200, which provides a bond between spring loaded bearing assembly 610 and top cover 200. Ball bearing 620 is steel or other conductive material and is biased towards face plate 625 by conductive spring 630 and protrudes beyond face plate 625 so that it contacts the top of front door 500. The top of front door 500 is masked where ball bearing 620 will contact front door 500, which provides a bond between bearing assembly 610 and front door 500. The bearing assemblies a-e positioned close enough to bushing 600 and hinge pin 545 so that front door 500 can open to approximately 160 degrees while maintaining the bond between front door 500 and top cover 200. The use of bearing assemblies 610 to create the bond between front door 500 and top cover 200 allows for the removal of front door 500 without the need to disconnect any jumper wires.

Alternatively, as can be seen in FIGS. 12B and 12E, rather than bonding front door 500 to base frame 100 through a spring loaded bearing assembly 610 in the top cover 200, front door 500 can be bonded to base frame 100 through locking hinge assemblies 535 and lifting screws 605 in door mount 15, which is bonded to base frame 100, as discussed above. To bond front door 500 in this manner, lifting screw 605 is first bonded to door mount 15. This can be done by using a trilobular lifting screw, by placing an internal tooth lock washer between the head of the lifting screw and the door mount, by using a lifting screw that has teeth on the under side of the head, or by paint masking the portion of the door mount that will contact the head of the lifting screw. Hinge pins 545 are then bonded to front door 500, such as by attaching a jumper wire between hinge pins 545 and front door 500. Therefore, when hinge pins 545 contact lifting screws 605, a bond is created between front door 500 and door mount 15 through the jumper wire, hinge pins 545, and lifting screws 605. Alternatively, if bushings are used in place of lifting screws 605, as described above, the bushings could be electrically connected to door mount 15 to provide the electrical connection between the hinge pin 545 and door mount 15. For example, an internal tooth lock washer could be placed between the head of the bushing and door mount 15, the bushing could have teeth on the under side of the head, or the area of door mount 15 that will contact the bushings could be paint masked.

As can be seen from the detailed descriptions above, in this embodiment when network cabinet 10 is fully assembled, all of the components of the cabinet are bonded together. The components that make up base frame 100 are all bonded by welding them together. Door mounts 15, equipment rails 20, and top cover 200 are bonded to the base frame by use of internal tooth lock washers, trilobular screws, etc. Side panels 300 are bonded to top cover 200 by use of grounding clips 335. Back doors 400 are grounded to top cover 200 by spring loaded grounding hinge mechanisms 435. Finally, front door 500 is grounded to top cover 200 by spring loaded bearing assemblies 610 or through locking hinge assemblies 535. By bonding all of the components of the cabinet together, separate grounding jumper wires are not required and network cabinet 10 is completely grounded and requires only a single point of contact with the main building ground (e.g. ground whip 25).

Figure 14A:
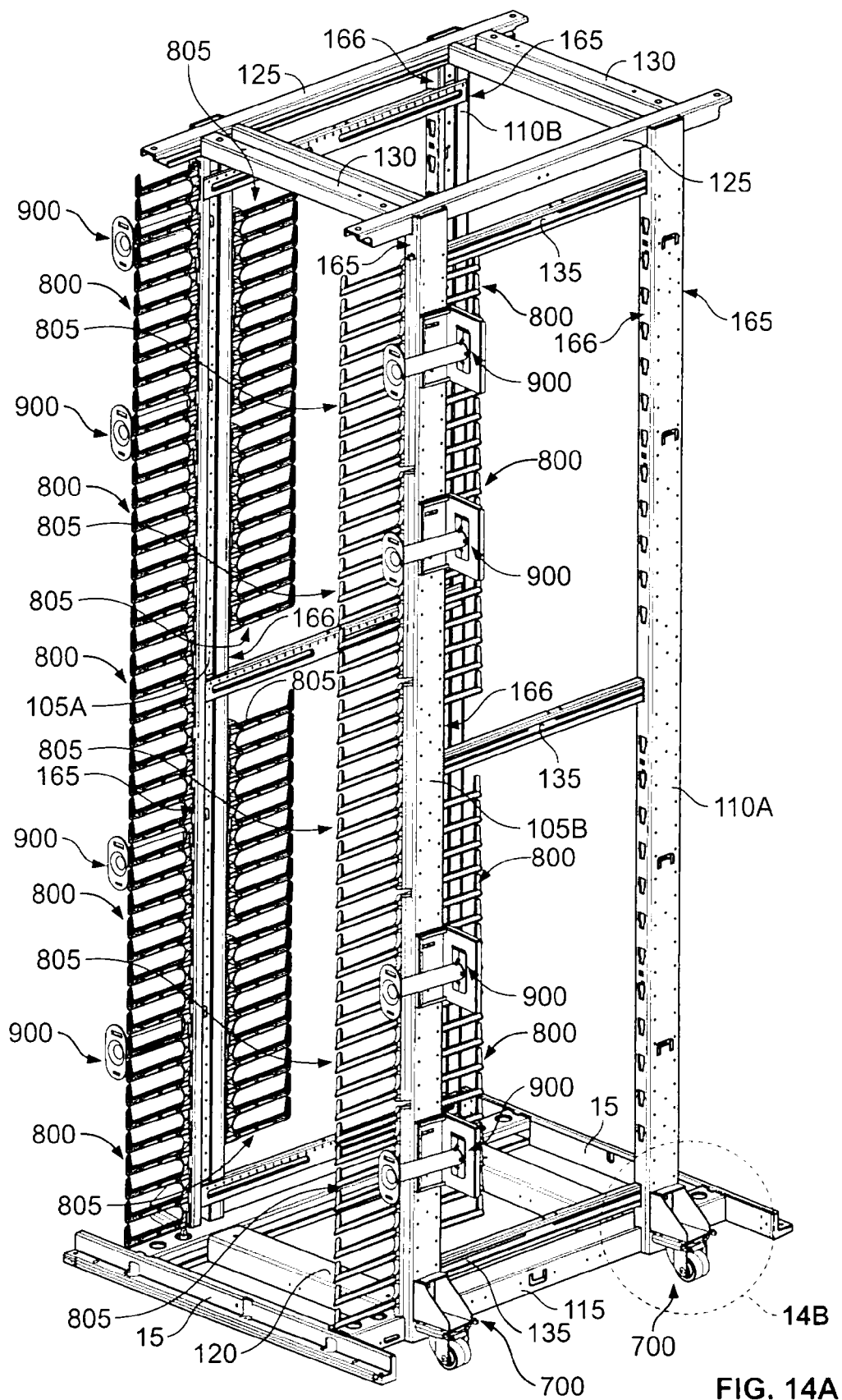
FIG. 14A is a front perspective view of the base frame of the network cabinet of the current invention with caster assemblies, cable management units, and slack management spools attached.

Referring to FIG. 14A, network cabinet 10 can also include caster assemblies 700, cable management fingers 800, and slack management spools 900.

Figure 14B:
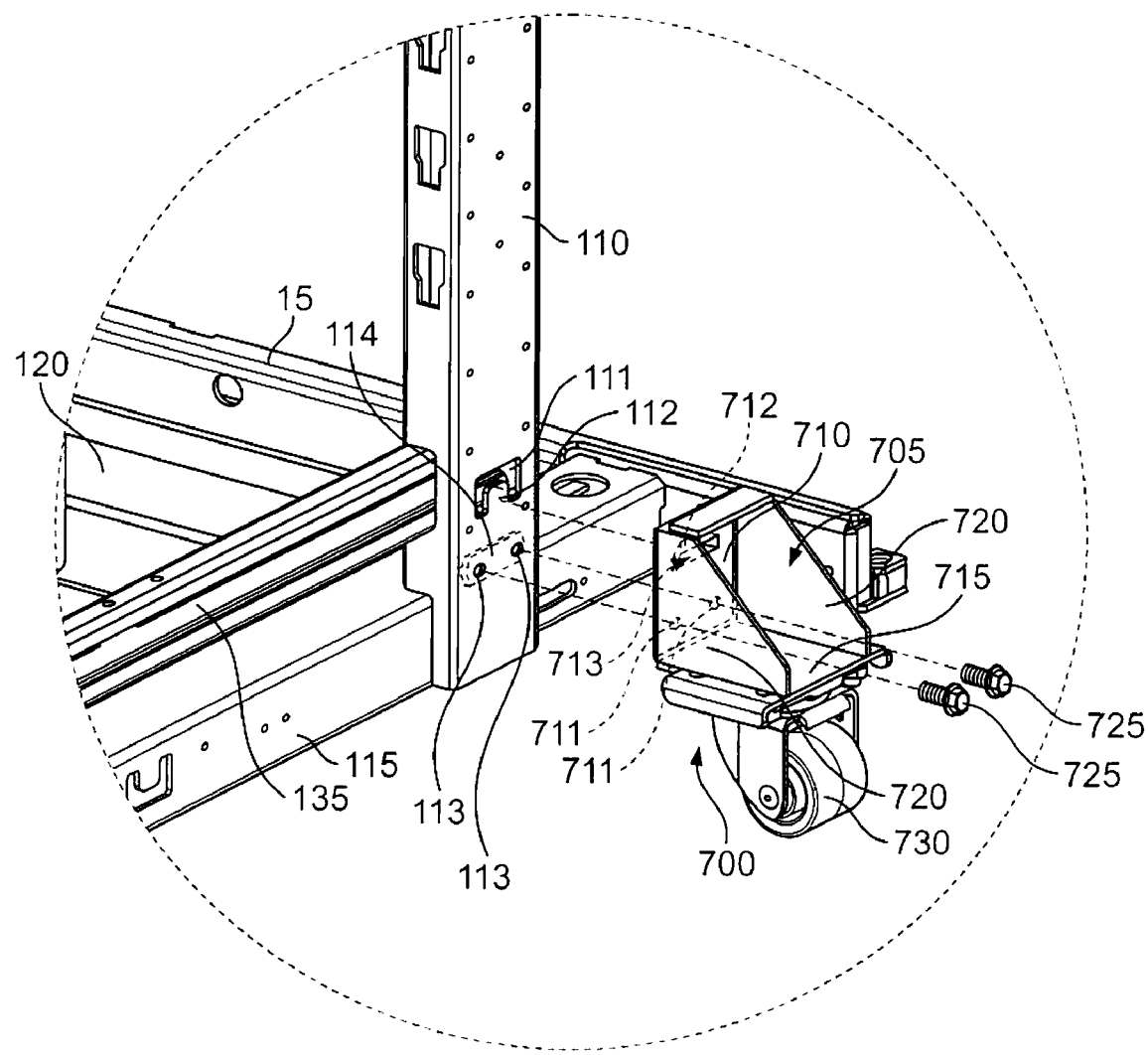
FIG. 14B is an exploded, enlarged partial view of a caster assembly shown in FIG. 14A.

Referring to FIGS. 14A and 14B, in this example caster assemblies 700 are mounted to the sides of front and back vertical frame rails 105, 110, alleviating the need to tip or turn network cabinet 10 or base frame 100 in order to install, remove, or repair caster assemblies 700. Caster assemblies 700 include a body 705, which is steel or other conductive material and is formed by a first wall 710, a second wall 715 that extends generally perpendicular to the attachment wall 710, and a pair of support walls 720 that extend between first wall 710 and second wall 715 to provide strength and rigidity to body 705.

A standard caster wheel 730 is attached to second wall 715 of body 705. First wall 710 of body 705 has a pair of holes 711 and a wall member 712 that extends from first wall 710 to form a slot 713 between wall member 712 and first wall 710.

As shown in FIG. 14B, to install caster assembly 700, base frame 100 is raised by rotating leveling legs 60. First wall 710 of caster assembly 700 is placed against back vertical frame rail 110 such that wall member 712 extends into an aperture 111 in vertical frame rail 110. Caster assembly 700 is then lowered such that a tongue 112 formed in aperture 111 engages slot 713 formed between wall member 712 and first wall 710 and holes 711 in first wall 710 are aligned with holes 113 that are formed in back vertical frame rail 110. A pair of bolts 725 are inserted through holes 711 in first wall 710 and holes 113 in back vertical frame rail 110 and are threaded into a jam-nut 114 that is welded to back vertical frame rail 110. Base frame 100 is then lowered by rotating leveling legs 60 until base frame 100 rests on caster assemblies 700. In addition to attaching caster assembly 700 to back vertical frame rail 110 bolts 725 and jam-nut 114 can also provide bonding between caster assembly 700 and back vertical frame rail 110. To create the bond, bolts 725 can have serrations or teeth on the underside of the head that bite through any paint into the metal of body 705 to provide a bond between body 705 and bolts 725. Alternatively, standard bolts could also be used with internal tooth lock washers to provide the bond or standard bolts could be used and the area around holes 711 could be paint masked to provide the bond it bonding is desired.

Figure 15A:
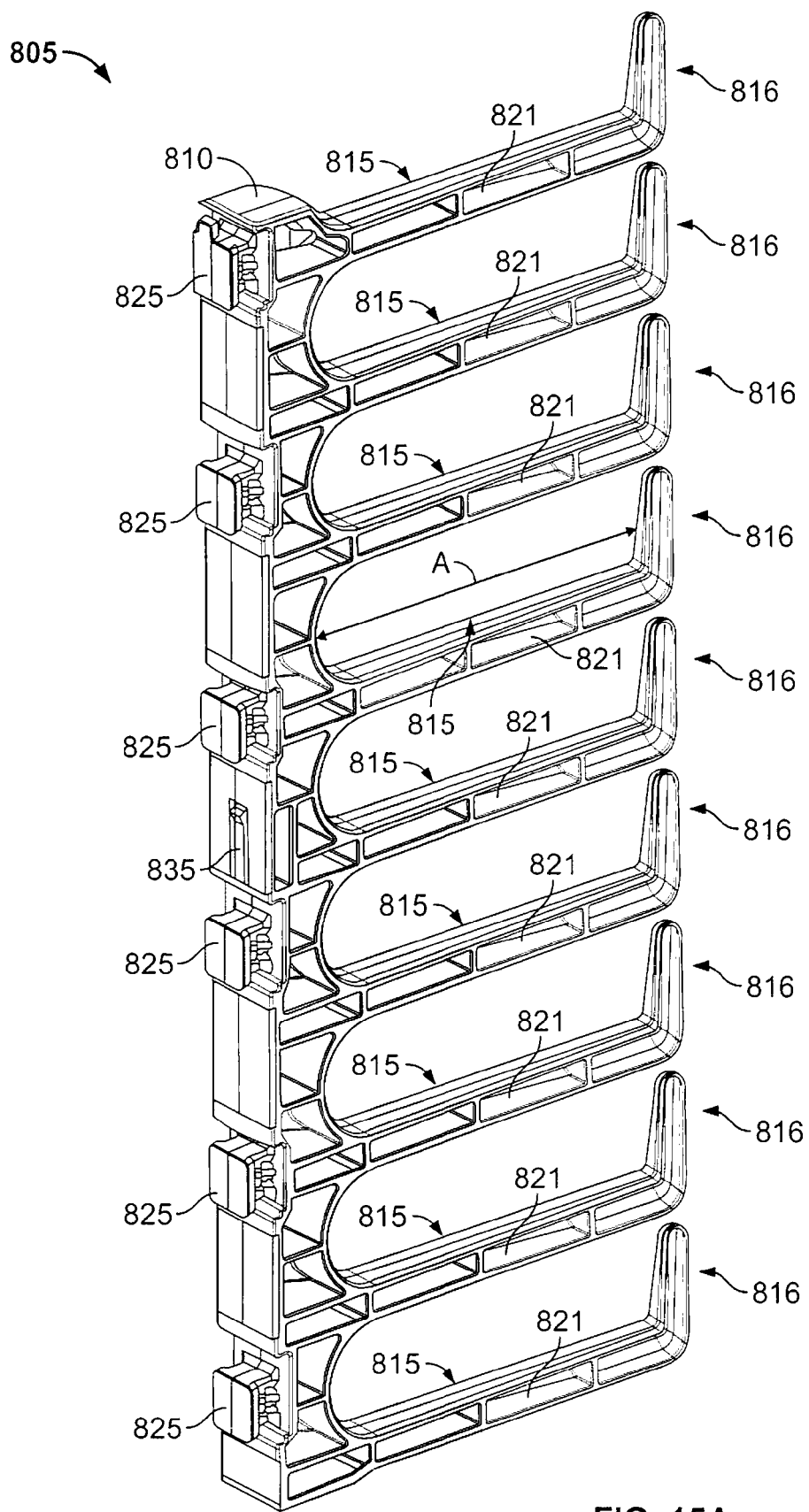
FIG. 15A is a back perspective view of a right hand cable management unit.
Figure 15B:
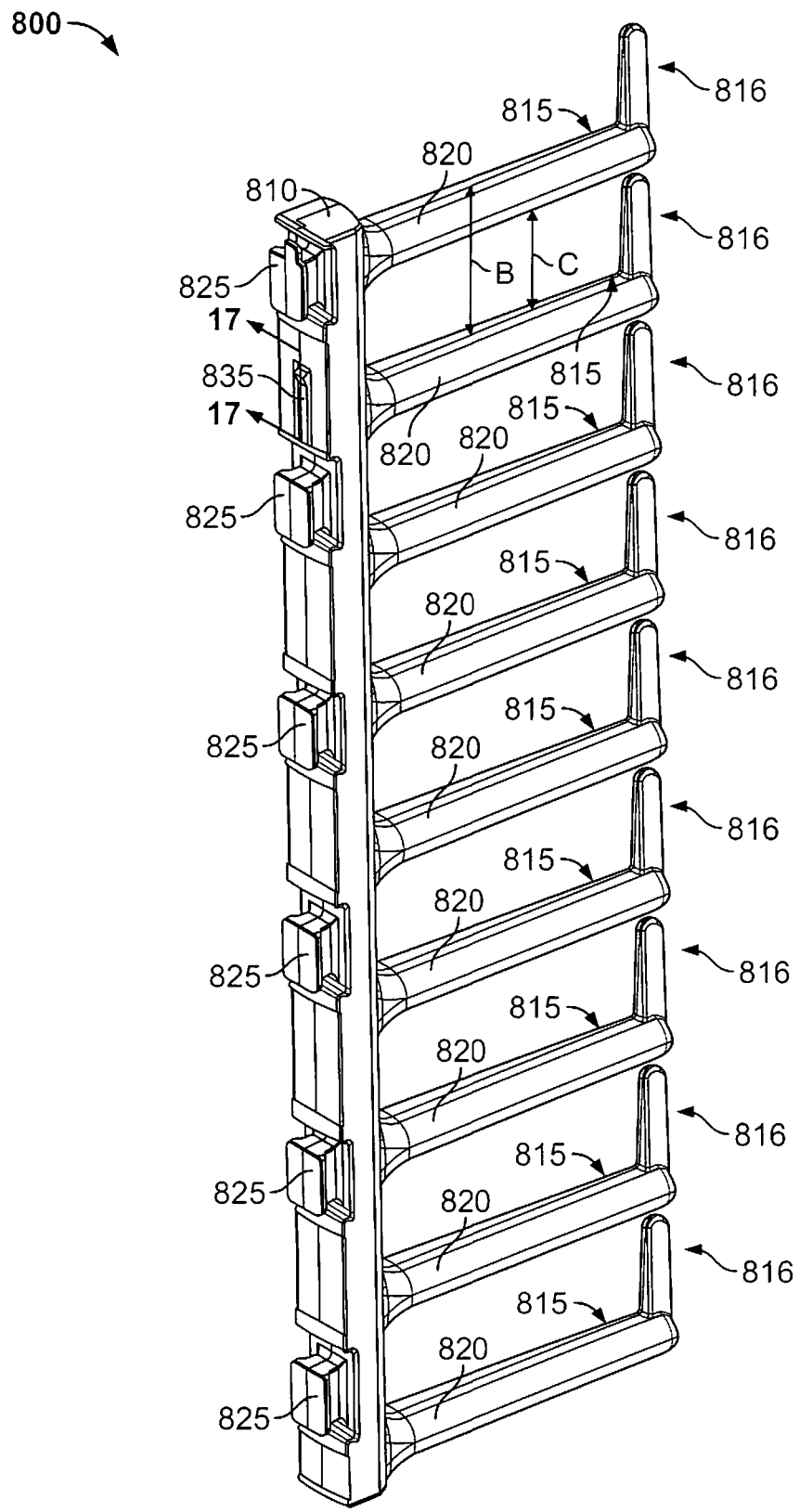
FIG. 15B is a back perspective view of a left hand cable management unit.

Referring to FIGS. 14A, 15A, and 15B, in this example multiple left hand cable management units 800 and right hand cable management units 805, which are mirror images of each other, can be mounted to front and back sidewalls 165, 166 of front vertical frame rails 105A, 105B and back vertical frame rails 110A. 110B. As used herein, the front sidewalls 165 of front and back vertical frames rails 105A, 105B, 110A, and 110B are the sidewalls having outer surfaces that face outward from base frame 100 and are directly accessible from the outside of base frame 100. The back sidewalls 166 of front and back vertical frame rails 105A, 105B, 110A, and 110B are the sidewalls having outer surfaces that are opposite the surfaces of the front sidewalls, face inward towards the inside of base frame 100, and are generally accessible from the inside or sides of base frame 100. For convenience, FIG. 14A shows left and right hand cable management units 800, 805 mounted only to the front and back sidewalls 165, 166 of front vertical frame rails 105A and 105B.

As described in more detail below, left hand cable management units 800 would be mounted to the front sidewalls 165 of left side front vertical frame rail 105A (left side when facing the cabinet from the front) and left side back vertical frame rail 110A (left side when facing tile cabinet from the back) and to the back sidewalls 166 of right side front vertical frame rail 105B and right side back vertical frame rail 110B. Right hand cable management units 805 would be mounted to the front sidewalls 165 of right side front vertical frame rail 105B and right side back vertical frame rail 110B and to the back sidewalls 166 of left side front vertical frame rail 105A and left side back vertical frame rail 110A. In this example, five cable management units 800, 805 can be mounted on the front sidewalls 165 of front and back vertical frame rails 105A, 105B, 110A, and 110B and four cable management units 800, 805 can be mounted in the back sidewalls 166 of front and back vertical frame rails 105A, 105B, 110A, and 110B.

As can best be seen in FIGS. 15A and 15B, in this example each cable management unit 800, 805 is molded plastic and includes a base 810 and nine fingers 815 that protrude and extend from base 810. Each finger 815 has a generally vertically oriented cable retainer 816 at its distal end (opposite the base 810) that prevents cables from spilling out of fingers 815 and provides approximately 6.2 inches of cable management length (shown as A in FIG. 15A) between base 810 and cable retainers 816. Each finger 815 has a semi-circular cross-section in which the outside surface 820 (the surface that faces outside base frame 100 when installed and will contact cables) is solid and has a bend radius of approximately 0.25 inches and inside surface 821 (the surface that faces inside base frame 100 when installed) is cored out to make fingers 815 generally hollow. The bend radius of outside surface 820 provides for the management of cable without any sharp corners which can damage the cables. Conversely, inside surface 821 does not generally contact the cables and therefore can be designed without bend radii and can be cored out for manufacturability purposes.

In the example shown, the spacing between the tops of adjacent fingers 815 is approximately 1.75 inches (shown as B in FIG. 15B), which is equivalent to one rack unit ("RU"). Each finger 815 has a height of approximately 0.5 inches, which provides approximately 1.25 inches of cable management height (shown as C in FIG. 15B). The finger height and spacing combine to allow for management of 48 Cat 6 cables, 24 cat6A cables, or other types of cabling, such as communication cabling, in each RU. The area where base 810 meets each finger 815 also has a bend radius of approximately 0.3 inches.

Figure 16A:
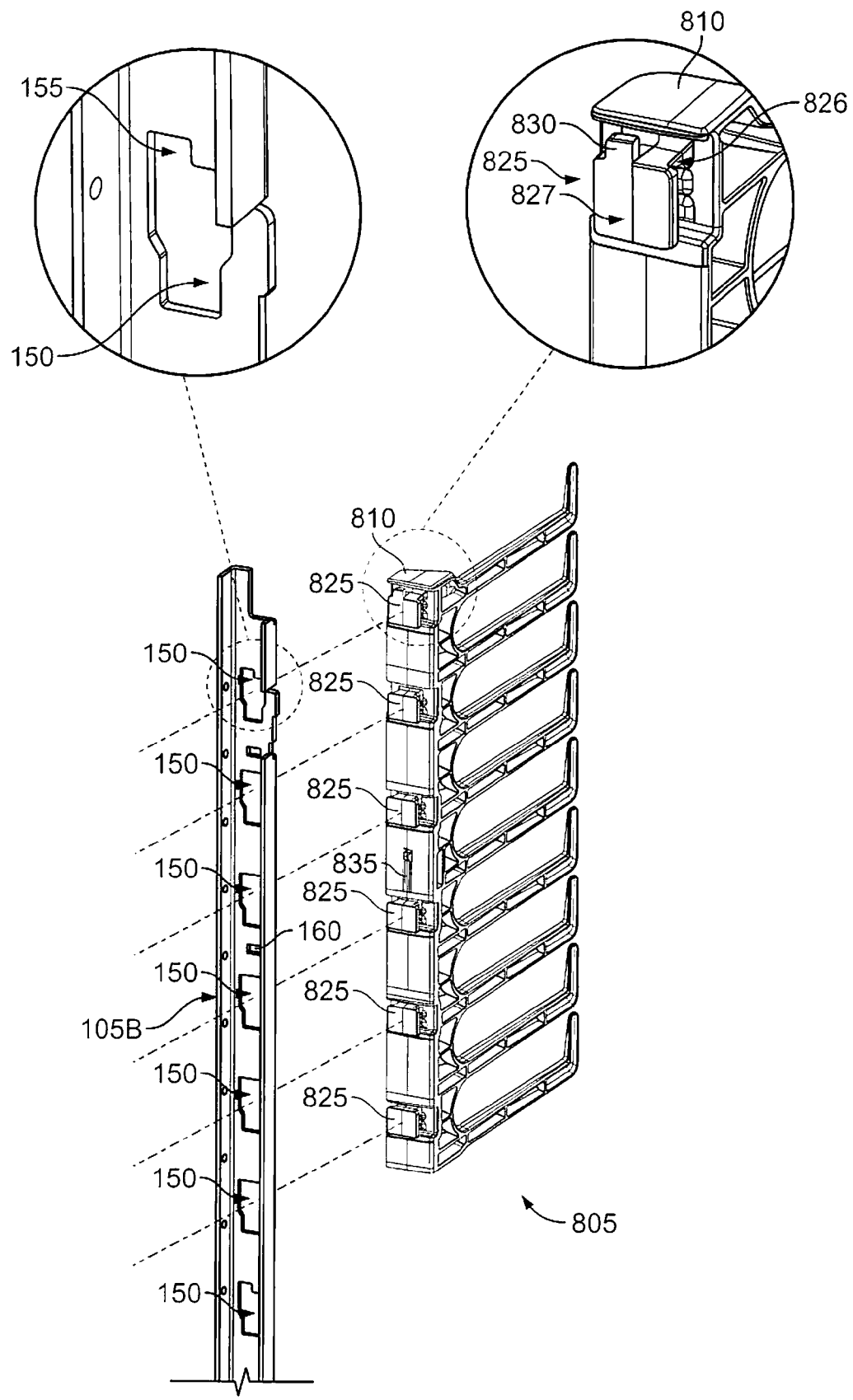
FIG. 16A is an exploded partial enlarged view showing the attachment of a right hand cable management unit to the base frame of the network cabinet of the present invention.
Figure 16B:
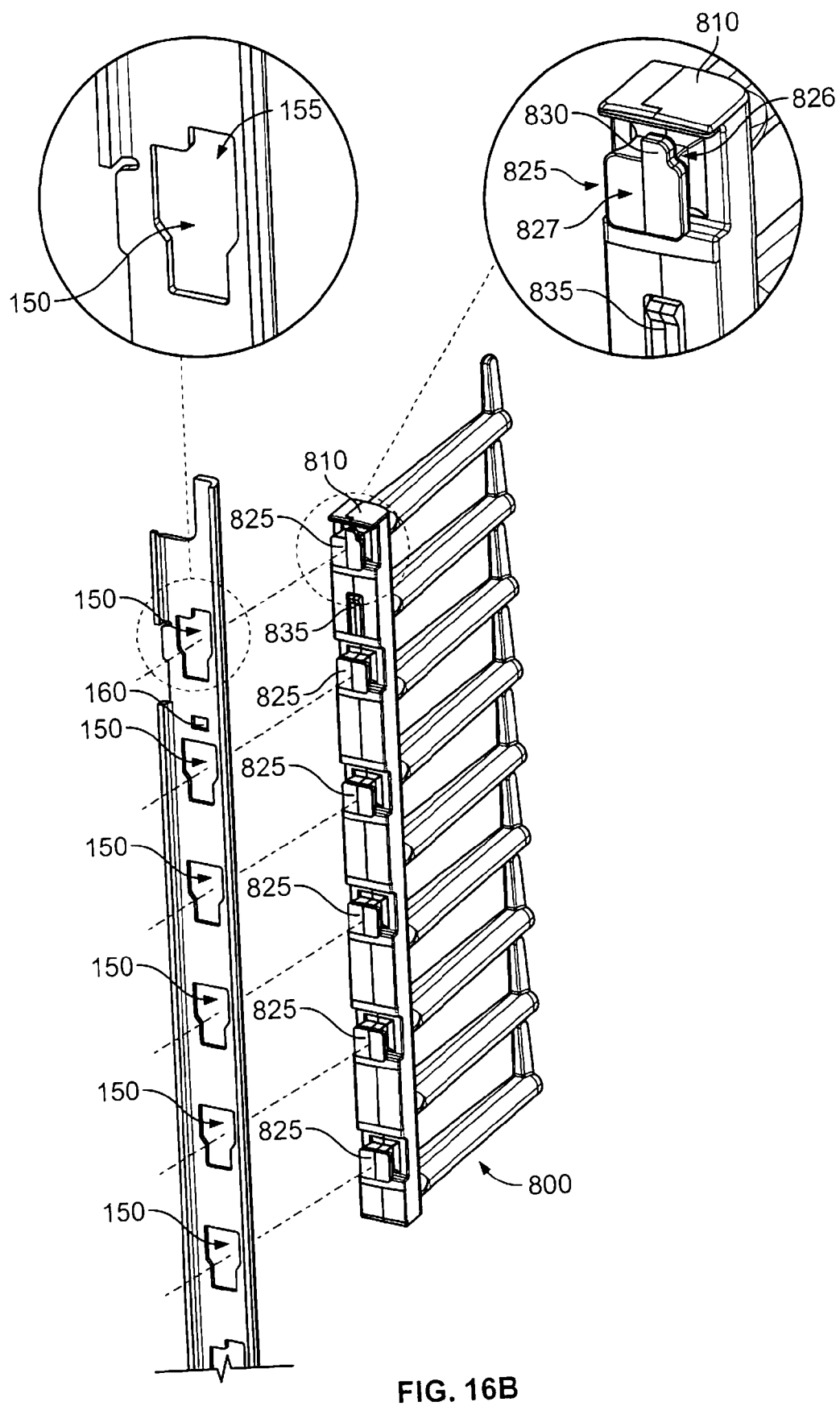
FIG. 16B is an exploded partial enlarged view showing the attachment of a left hand cable management unit to the base frame of the network cabinet of the present invention.

Referring additionally to FIGS. 16A and 16B, in this example each cable management unit 800, 805 includes buttons 825, or projections, that protrude from the back surface of base 810, opposite the fingers 815. Buttons 825 are adapted to engage corresponding apertures 150 in the sidewalls 165, 166 of front and back vertical frame rails 105, 110 to mount cable management units 800, 805 to vertical frame rails 105, 110. Buttons 825 each have a head portion 827 that has a size and shape such that the head portion 827 can be inserted through the upper portion of apertures 150 and a neck portion 826 that has a size and shape such that the neck portion 826 fits in the lower portion of apertures 150, which is smaller than the upper portion. In the example shown, buttons 825 and apertures 150 have a generally quadrilateral shape but could be any shape required by a particular application. Head portions 827 of buttons 825 are inserted into upper portions of corresponding apertures 150 until head portion 827 protrudes completely through aperture 150. Cable management unit 800, 805 is then pushed down such that neck portion 826 engages the lower portion of aperture 150 to snap it into place. Head portion 827 is larger than the lower portion of aperture 150 and prevents cable management unit 800, 805 from being removed. This allows the manual assembly and removal of cable management units 800, 805 with no additional fasteners or tools. In addition, when multiple cable management units are mounted, a gap of approximately 0.75 inches is left between adjacent units to allow for removal of individual units without having to remove units mounted above.

As can best been seen in the enlarged partial views in FIGS. 16A and 16B, on each cable management unit 800, 805, one of the buttons 825 will also include a protrusion 830 that extends laterally from one side of the button, typically from head portion 827. In the example shown, protrusion 830 extends from the top of the button and is skewed to the left for left hand cable management units 800 and skewed to the right for right hand cable management units 805. This protrusion 830 is adapted to coincide with a slot 155 that extends from one side of an aperture 150, typically from the upper portion. One button on each cable management unit 800, 805 will have a protrusion 830 and only selected apertures 150 in vertical frame rails 105, 110 will have slots 155, which act as a keying feature to prevent cable management units 800, 805 from being mounted on the wrong side of a vertical frame rail 105, 110 or from being mounted upside down. Having slots 155 only in predetermined apertures 150 also requires that cable management units 800, 805 be mounted in predetermined positions. Alternatively, all of the buttons 825 could have protrusions 830 and all apertures 150 could have slots 155. This would allow the vertical positioning of the cable management units 800, 805 anywhere along a vertical frame rail while still preventing the mounting on the wrong side of a vertical frame rail or mounting upside down. In addition, to allow the mounting of cable management units 800, 805 on either side of a vertical frame rail and anywhere along a vertical frame rail, there would be no protrusions on any of the buttons 825 and no slots on any of the apertures 150. Although protrusions on the buttons and slots in the apertures halve been described herein as the method for controlling where cable management units can be positioned along the vertical frame rails, it will be understood that other variations of the size and shape of the buttons and apertures could also be used.

Figure 17:
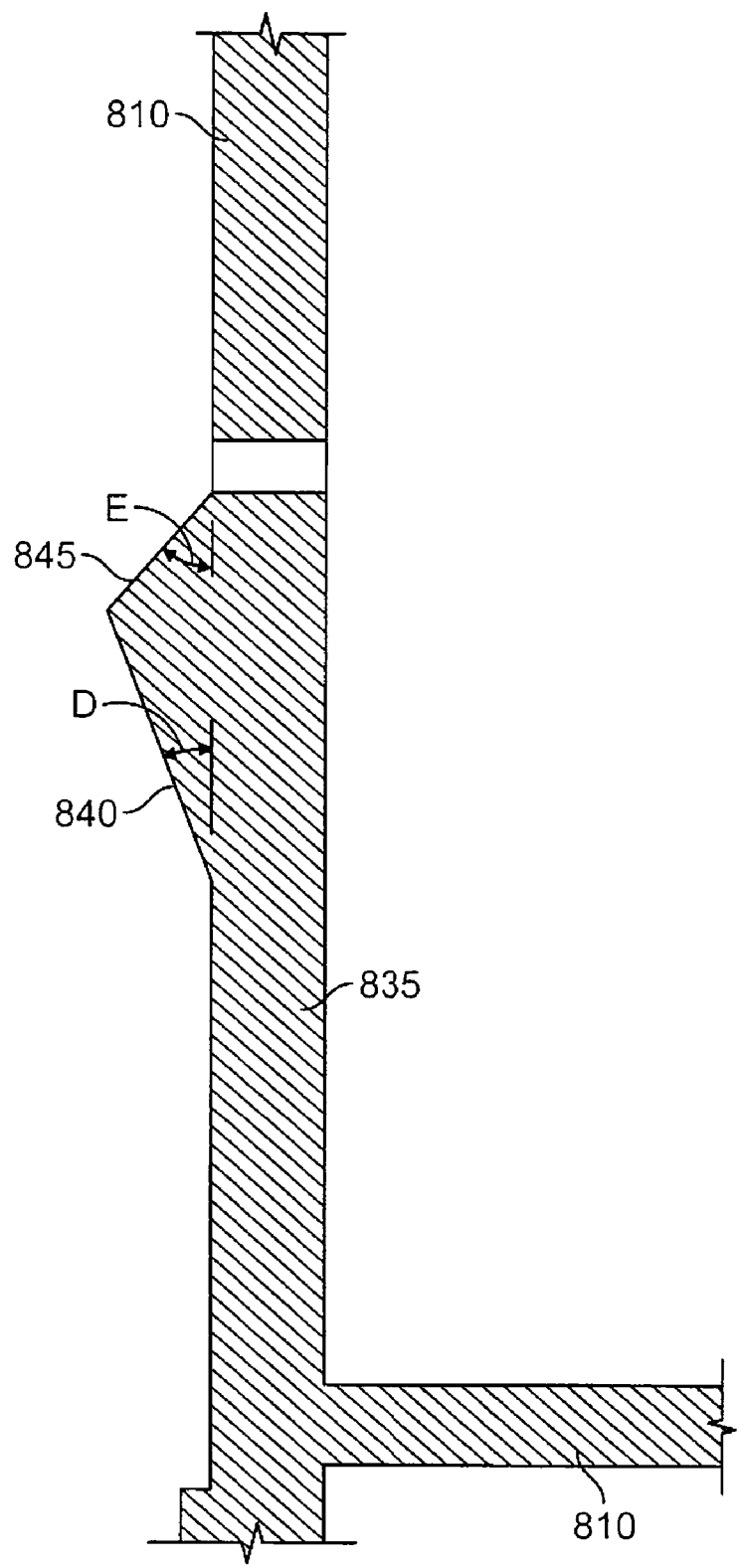
FIG. 17 is a cross-sectional view taken along line 17-17 in FIG. 15B.

As can best be seen in FIGS. 15A, 15B, and 17, each cable management unit 800, 805 can also have a cantilevered locking finger 835 formed in the back surface of base 810. The outside surface of locking finger 835 has a shallow inclined lead in face 840, which is angled from the back surface approximately 20-40 degrees (lead in angle shown as D in FIG. 17), and a steep inclined lead out face 845, which is angled from the back surface approximately 30-50 degrees (lead out angle shown as E in FIG. 17). Locking finger 835 and faces 840, 845 are adapted to engage and snap into a locking slot 160 in vertical frame rails 105, 1110 (see FIGS. 16A and 16B) to secure cable management units 800, 805 to vertical frame rails 105, 110. The shallow lead in angle D allows for easy mounting of the cable management units 800, 805, while the steep lead out angle E provides more resistance so that cable management units 800, 805 can be, but are not easily, removed.

Figure 18A:
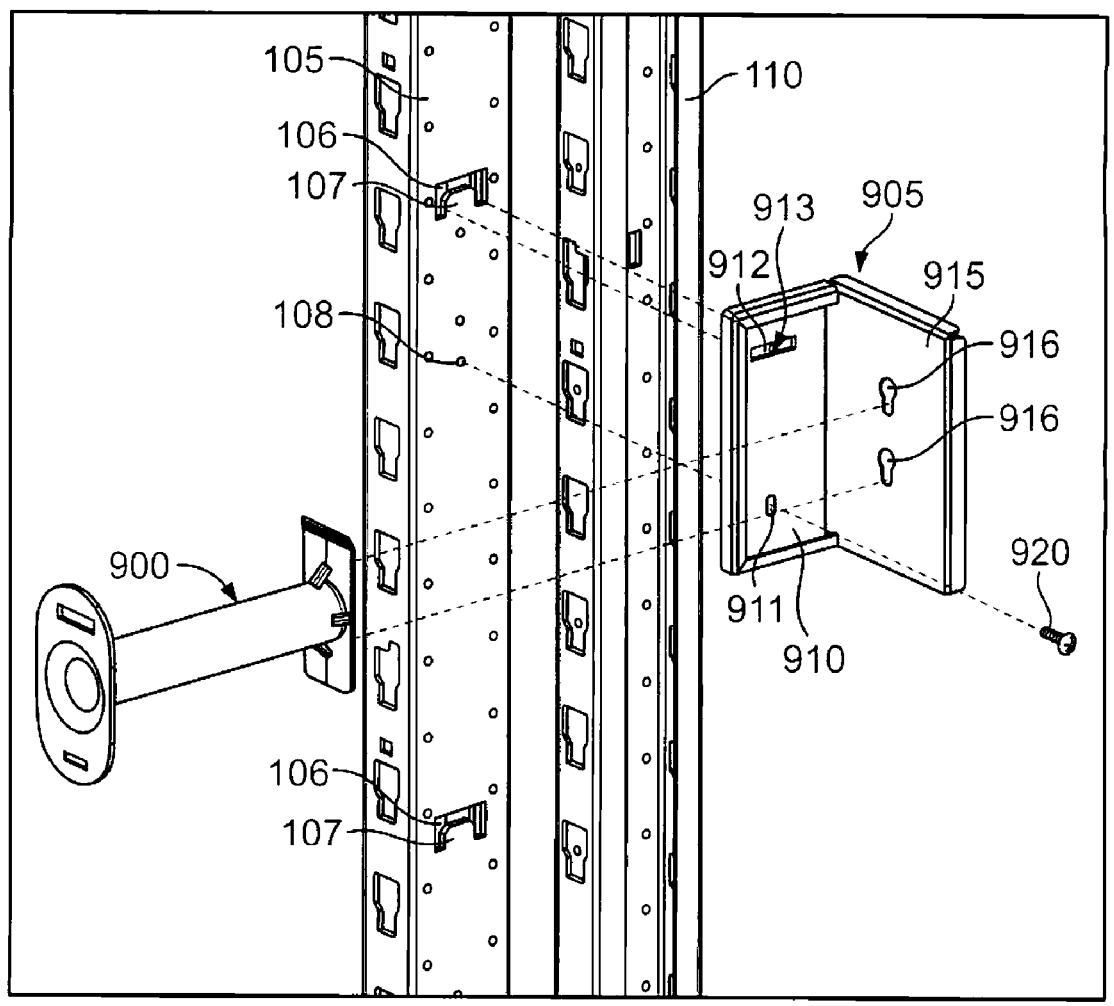
FIG. 18A is an exploded partial enlarged view showing the attachment of a slack management spool to the base frame of the network cabinet of the present invention.
Figure 18B:
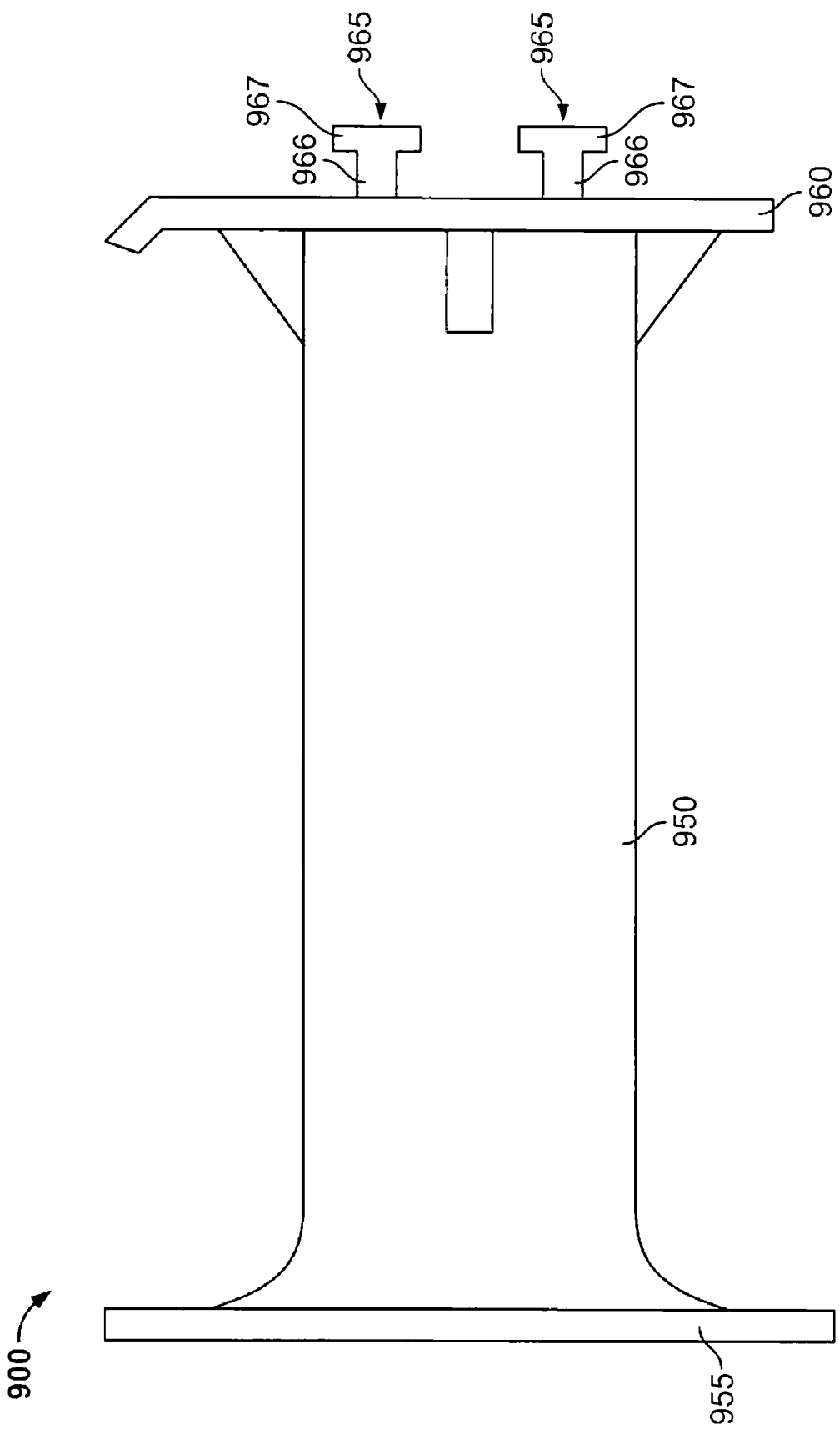
FIG. 18B is a side view of the slack management spool shown in FIG. 18A.

Referring to FIGS. 14A, 18A, and 18B, slack management spools 900 can also be mounted to front and back vertical frame rails 105, 110 via brackets 905.

Referring specifically to FIG. 18B, a slack management spool 900 is shown that, in this example, is plastic and includes a generally cylindrical spool body 950, a stop wall 955 formed at one end of the spool body 950, and a mounting wall 960 formed at the second end of the spool body 950 opposite the stop wall 955. The mounting wall 960 has a pair of generally cylindrical protrusions 965 that are adapted to engage mounting holes in the brackets 905, as seen in FIG. 18A and as discussed in more detail below. Each of the protrusions 965 has a first section 966 that extends from the surface of the mounting wall 960 and has a first dimension and a second section 967 at the end of the first section 966 that has a second dimension, which is greater than the first dimension. In this example, first section 966 and second section 967 are generally circular in design, wherein the first and second dimensions are diameters.

Referring specifically to FIG. 18A, the mounting of a slack management spool 900 to a front vertical frame rail 105 by a bracket 905 is shown. Bracket 905, in this example, is steel and is generally "L" shaped having a first wall 910 and a second wall 915 that extends generally perpendicular to the first wall 910. Alternatively, bracket 905 could be made in any geometry and of any material appropriate for a given application. First wall 910 has a hole 911 and a wall member 912 that extends from first wall 910 to form a slot 913 between wall member 912 and first wall 910. Second wall 915 has a pair of mounting holes 916 that are adapted to receive and secure the protrusions extending from mounting wall 960 of slack management spools 900.

To mount a bracket 905 to a front vertical frame rail 105, first wall 910 of bracket 905 is placed against the front vertical frame rail 105 such that wall member 912 extends into an aperture 106 in front vertical frame rail 105. Apertures 106 are positioned spaced apart along vertical frame rails 105, 110. In this example, four apertures 106 are provided in each vertical frame rail 105, 110, as can be seen in FIG. 14A. Bracket 905 is then lowered such that a tongue 107 formed in aperture 106 engages slot 913 formed between wall member 912 and first wall 910. Bracket 905 is lowered until hole 911 in first wall 910 is aligned with a hole 108 formed in the front vertical frame rail 105. A trilobular screw 920 can be inserted through hole 911 in first wall 910 and is threaded into hole 108 in front vertical frame rail 105. Trilobular screw 920 provides a bond to the front vertical frame rail 105 by cutting threads into the metal of front vertical frame rail 105. To provide a bond between trilobular screw 920 and bracket 905, trilobular screw 920 has serrations or teeth on the underside of the head that bite into the metal of bracket 905. Alternatively, a standard bolt could be used with an internal tooth lock washer or a standard bolt could be used and the area around hole 911 could be paint masked and the area within hole 108 Could be paint masked as well if bonding is desired.

Slack management spool 900 is then mounted to bracket 905 by inserting protrusions 965 extending from mounting wall 960 through mounting holes 916 in bracket 905 and sliding spool 900 downward until the first section 966 of protrusions 965 engage mounting holes 916.

Figure 20:
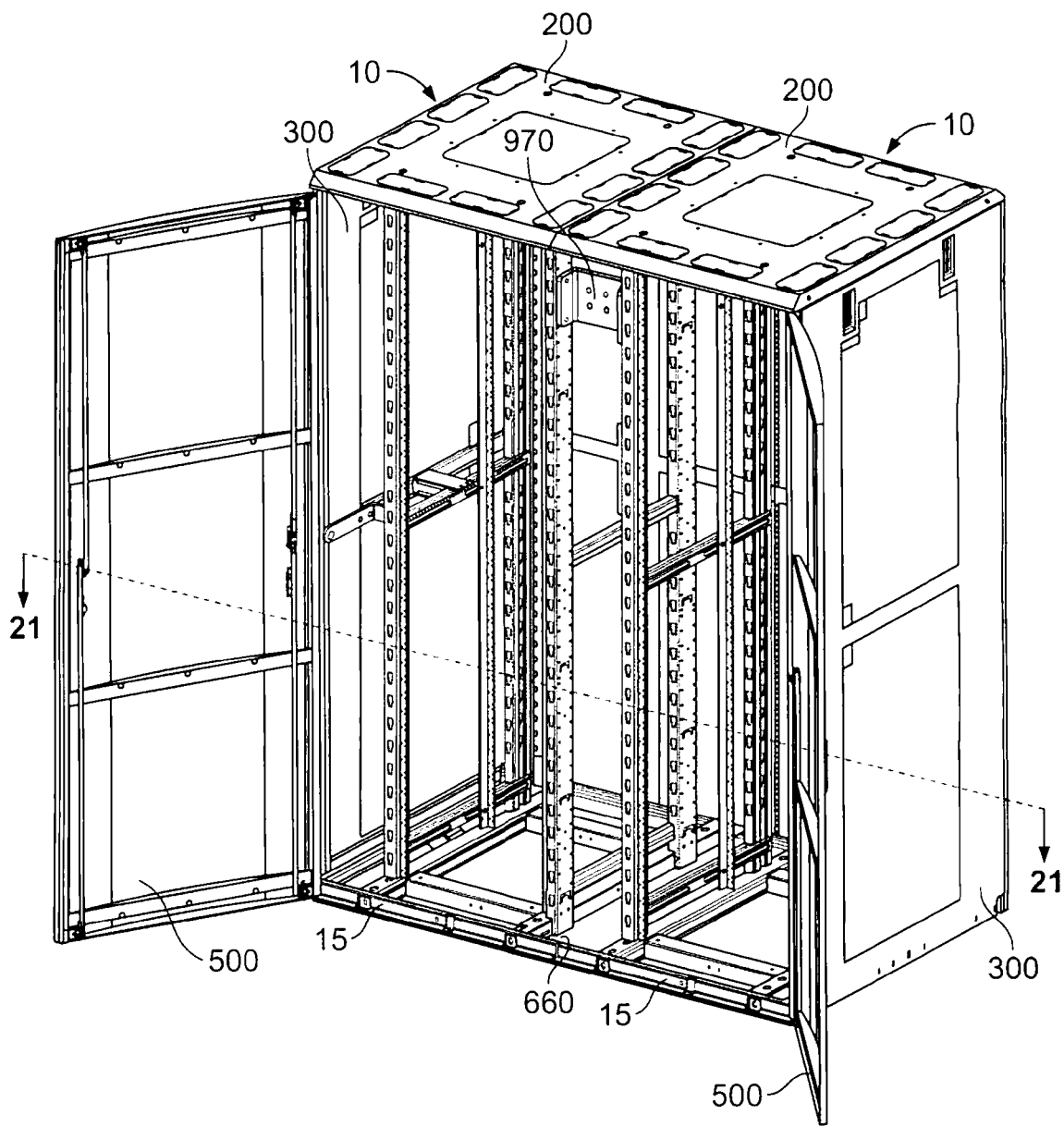
FIG. 20 is a front perspective view of the network cabinets in FIG. 19, with the front doors open.
Figure 21:
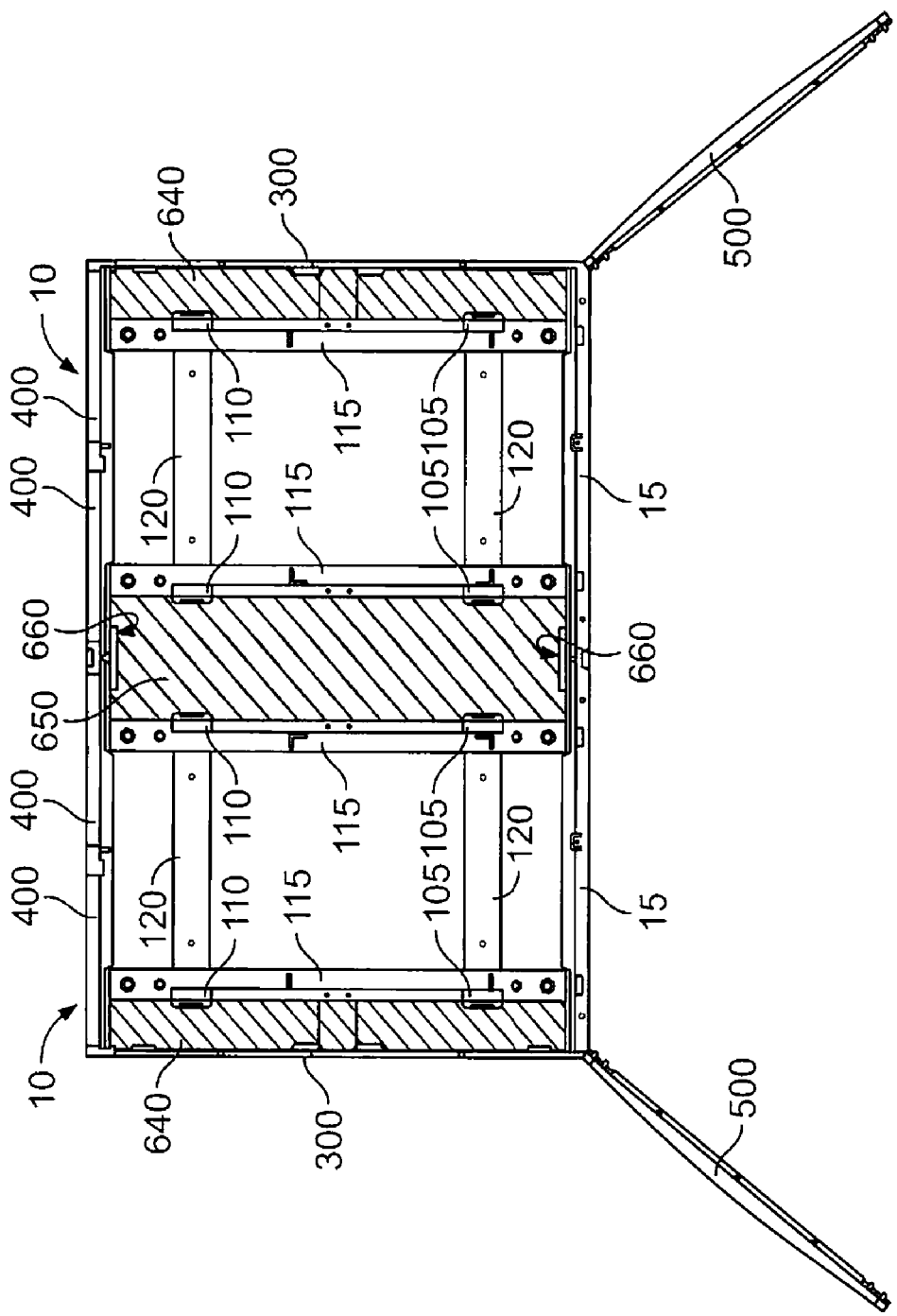
FIG. 21 is a cross-sectional view taken along line 21-21 in FIG. 20.

Referring to FIGS. 19-21, there is shown two network cabinets 10 that are ganged, or joined, together. To gang two network cabinets 10 together the left side panel 300 of the right cabinet is removed and the right side panel 300 is removed from the left cabinet. The cabinets are then positioned next to each other such that the sides with side panels 300 removed are positioned adjacent one another. Top covers 200 of the adjacent network cabinets 10 are secured together by inserting bolts through holes in the adjacent side flanges 202 (not shown in FIGS. 19-21) of top covers 200 and threading nuts onto the bolts to secure the top covers 200 together. Generally "L" shaped steel brackets 660 are also bolted or screwed to the adjacent ends of front and back door mounts 15. In additions generally "U" shaped double spool brackets 970 could also be attached between the adjacent front vertical frame rails 105 and back vertical frame rails 110 of the ganged cabinets.

Referring specifically to FIG. 21, the cross hatched areas (side cable management pathways 640 and center cable management pathway 650) show the cable management pathways that are created as a result of inset frame stricture of the network cabinets 10 when two network cabinets 10 are ganged together. Side cable management pathways 640 are bounded by side panels 300 on the outside and Front and back vertical frame rails 105, 1110 and front to back support beams 135 on the inside. Center cable management pathway 650 is a larger cable management pathway that is bounded on the left and right by tile adjacent front and back vertical frame rails 105, 110 and front to back support beams 135. Hinging front doors 500 outward (as shown in FIG. 21) provides clear access to center cable management pathway 650. Hinging front doors 500 inward provides clear access to the corresponding side cable management pathways 640, which can also be clearly accessed by removing the corresponding side panel 300.

What is claimed is:

1. A network cabinet, comprising:
   a support frame;
   an adjustable conductive member electrically coupled to the support frame; and
   a door including a hinge assembly comprising a conductive hinge pin, the conductive hinge pin engaging the adjustable conductive member to electrically connect the door to the support frame;
   wherein the adjustable conductive member is a threaded member.

2. The network cabinet of claim 1, wherein the hinge assembly is electrically connected to the support frame.

3. The network cabinet of claim 1, wherein the hinge assembly is electrically connected to the door.

4. The network cabinet of claim 1, wherein the hinge assembly further comprises a conductive body electrically connected to the door and the conductive hinge pin is electrically connected to the body.

5. The network cabinet of claim 4, wherein the hinge pin is positioned within the body.

6. The network cabinet of claim 4, wherein the body is welded to the door.

7. The network cabinet of claim 4, wherein the hinge pin is retractable.

8. The network cabinet of claim 1, further comprising a top cover electrically connected to the support frame, wherein the door is electrically connected to the support frame through the top cover.

9. The network cabinet of claim 8, wherein the conductive hinge pin is electrically connected to the door and to the top cover.

10. The network cabinet of claim 9, wherein the hinge assembly further comprises a conductive body electrically connected to the door, wherein the hinge pin is electrically connected to the body.

11. The network cabinet of claim 10, wherein the hinge pin is positioned within the body.

12. The network cabinet of claim 9, wherein the adjustable conductive member is electrically connected to the top cover, wherein the hinge pin contacts the adjustable conductive member to provide the electrical connection between the top cover and the hinge pin.

13. The network cabinet of claim 1, wherein the hinge pin is movable between retracted and extended positions.

14. The network cabinet of claim 1, wherein the support frame comprises a base frame and a door mount.

15. The network cabinet of claim 1, wherein the threaded member is a trilobular screw.

16. The network cabinet of claim 1, further comprising a top cover electrically connected to the support frame, wherein the adjustable conductive member is electricalty connected to the top cover.

* * * * *

UNITED STATES PATENT AND TRADEMARK OFFICE
CERTIFICATE OF CORRECTION

PATENT NO. : 7,667,135 B2
APPLICATION NO. : 11/926847
DATED : February 23, 2010
INVENTOR(S) : Samuel J. Adducci et al.

It is certified that error appears in the above-identified patent and that said Letters Patent is hereby corrected as shown below:

Column 1, line 34 which reads "hinge pill is movable between retracted and extended positions" should read "hinge pin is movable between retracted and extended positions".

Column 1, line 37 which reads "with the support frame and is aligned with the hinge pill" should read "with the support frame and is aligned with the hinge pin".

Column 1, line 43 which reads "10 the support frame through a hinge assembly" should read "to the support frame through a hinge assembly".

Column 3, line 32 which reads "Referring to FIG. 1 one embodiment of a network cabinet" should read "Referring to FIG. 1, one embodiment of a network cabinet".

Column 3, line 44 which reads "vertical frame rails 105, a pair of back vertical frame rails 10" should read "vertical frame rails 105, a pair of back vertical frame rails 110".

Column 3, line 66 which reads "have a generally "C" shaped cross-section geometry and ale" should read "have a generally "C" shaped cross-section geometry and are".

Column 6, line 16 which reads "from the bottom side of tile top cover 200 such that they align" should read "from the bottom side of the top cover 200 such that they align".

Column 8, line 60 which reads "shown, one of the back doors 400 has a latch mechanism 405" should read "shown, one of the back doors 400' has a latch mechanism 405".

Column 8, line 63 which reads "accessible from the outside of back door 400 and can also" should read "accessible from the outside of back door 400' and can also".

Column 11, line 57 which reads "15 or top cover 200 and front door 500 is (fully secured" should read "15 or top cover 200 and front door 500 is fully secured".

Signed and Sealed this
Twenty-fourth Day of May, 2011

David J. Kappos
*Director of the United States Patent and Trademark Office*

CERTIFICATE OF CORRECTION (continued)
U.S. Pat. No. 7,667,135 B2

Column 16, line 11 which reads "rail 110 bolts 725 and jam-nut 114 can also provide bonding" should read "rail 110, bolts 725 and jam-nut 114 can also provide bonding".

Column 19, line 17 which reads "could be paint masked and the area within hole 108 Could be" should read "could be paint masked and the area within hole 108 could be".

Column 19, line 50 which reads "bounded by side panels 300 on the outside and Front and back" should read "bounded by side panels 300 on the outside and front and back".

Column 19, line 51 which reads "vertical frame rails 105, 1110 and front to back support beams" should read "vertical frame rails 105, 110 and front to back support beams".